(12) United States Patent
Noda et al.

(10) Patent No.: US 11,813,845 B2
(45) Date of Patent: Nov. 14, 2023

(54) LIGHT IRRADIATOR AND LIQUID DISCHARGE APPARATUS

(71) Applicant: BROTHER KOGYO KABUSHIKI KAISHA, Nagoya (JP)

(72) Inventors: Masahiro Noda, Ogaki (JP); Atsushi Ito, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 7 days.

(21) Appl. No.: 17/552,291

(22) Filed: Dec. 15, 2021

(65) Prior Publication Data

US 2022/0194095 A1    Jun. 23, 2022

(30) Foreign Application Priority Data

Dec. 17, 2020 (JP) .................................. 2020-209213

(51) Int. Cl.
*B41J 11/00* (2006.01)

(52) U.S. Cl.
CPC ............................... *B41J 11/00218* (2021.01)

(58) Field of Classification Search
CPC .................................................. B41J 11/00218
See application file for complete search history.

(56) References Cited

U.S. PATENT DOCUMENTS

| | | | | |
|---|---|---|---|---|
| 10,137,703 B2 * | 11/2018 | Tsuchiya | ............ | B41J 11/00214 |
| 2005/0104946 A1 * | 5/2005 | Siegel | ................. | B41F 23/0409 |
| | | | | 347/102 |
| 2008/0151029 A1 * | 6/2008 | Yokoyama | ......... | B41J 11/00214 |
| | | | | 347/102 |
| 2016/0033089 A1 * | 2/2016 | Wang | ................. | B41J 11/00218 |
| | | | | 362/244 |
| 2016/0193853 A1 * | 7/2016 | Fujisawa | ............ | B41J 11/00212 |
| | | | | 347/102 |
| 2017/0341382 A1 * | 11/2017 | Kasai | ................... | B41J 2/14072 |
| 2020/0316964 A1 * | 10/2020 | Matsushima | ....... | H01L 25/0753 |

FOREIGN PATENT DOCUMENTS

| | | |
|---|---|---|
| JP | 2009-087879 A | 4/2009 |
| JP | 2015-058670 A | 3/2015 |

* cited by examiner

*Primary Examiner* — Sean M Luck

(74) *Attorney, Agent, or Firm* — Kenealy Vaidya LLP

(57) ABSTRACT

There is provided a light irradiator including: light sources forming first and second light source rows; a heat sink; a substrate including first and second traces connected to the first and second light source rows, respectively; and a fixing part configured to fix the heat sink to the substrate. The fixing part is arranged between adjacent light sources included in the first light source row and adjacent in the first light source row; and the fixing part is not arranged between adjacent light sources included in the second light source row and adjacent in the second light source row. The first trace includes a first circumventing part configured to circumvent the fixing part; and the second trace includes a second circumventing part configured to circumvent the fixing part and having a directional component different from the first direction.

20 Claims, 13 Drawing Sheets

LIGHT IRRADIATOR AND LIQUID DISCHARGE APPARATUS

CROSS REFERENCE TO RELATED APPLICATIONS

The present application claims priority from Japanese Patent Application No. 2020-209213, filed on Dec. 17, 2020, the disclosure of which is incorporated herein by reference in its entirety.

BACKGROUND

Description of the Related Art

A printing apparatus is an example of a liquid discharging apparatus. A publicly known printing apparatus is provided with a printing head configured to discharge or eject a photo curable ink, and a light source substrate to which light emitting elements configured to irradiate the discharged ink with a light are attached. Further, in the printing apparatus, a hole for fixing (fixing hole) is provided in the light source substrate at a location between the light emitting elements, and a fixing member is inserted into the fixing hole to thereby fix the light source substrate to a heat conducting member.

SUMMARY

In the above-described printing apparatus, the fixing hole is provided on the light source substrate to which the light emitting elements are attached. Accordingly, in a case, for example, that a trace connected to a part of the light emitting elements is arranged so as to avoid the fixing hole, there arises any difference in the length of trace among the light emitting elements, depending on the position of the fixing hole. Accordingly, due to the difference in the length of trace, there arises any difference, among the light emitting elements, in the current flowing through each of the light emitting elements, which in turn leads to any unevenness in the illuminance among the light emitting elements.

An object of the present disclosure is to provide a light irradiator and a liquid discharging apparatus each of which relates to lowering of the unevenness (variation) in illuminance among the light sources.

According to an aspect of the present disclosure, there is provided a light irradiator including: a plurality of light sources; a heat sink; a substrate; and a fixing part. The plurality of light sources are attached to the substrate. The substrate includes a plurality of traces connected to the plurality of light sources. The fixing part is configured to fix the heat sink to the substrate. The plurality of light sources form a first light source row extending in a first direction, and a second light source row extending in the first direction and arranged side by side to the first light source row in a second direction orthogonal to the first direction. The fixing part is arranged between adjacent light sources of light sources, among the plurality of light sources, included in the first light source row, the adjacent light sources being adjacent in the first light source row. The fixing part is not arranged between adjacent light sources, of light sources, among the plurality of light sources, included in the second light source row, the adjacent light sources being adjacent in the second light source row. The plurality of traces include a first trace connected to the light sources included in the first light source row, and a second trace connected to the light sources included in the second light source row. The first trace includes a first circumventing part configured to circumvent the fixing part. The second trace includes a second circumventing part configured to circumvent the fixing part and having a directional component different from the first direction.

According to another aspect of the present disclosure, there is provided a light irradiator including: a plurality of light sources; a heat sink; a substrate; and a fixing part. The plurality of light sources are attached to the substrate. The substrate includes a plurality of traces connected to the plurality of light sources. The fixing part is configured to fix the heat sink to the substrate. The plurality of light sources form a first light source row extending in a first direction, and a second light source row extending in the first direction and arranged side by side to the first light source row in a second direction orthogonal to the first direction. The fixing part is arranged between adjacent light sources of light sources, among the plurality of light sources, included in the first light source row, the adjacent light sources being adjacent in the first light source row. The fixing part is not arranged between adjacent light sources, of light sources, among the plurality of light sources, included in the second light source row, the adjacent light sources being adjacent in the second light source row. The number of the light sources included in the first light source row is smaller than the number of the light sources included in the second light source row. The trace includes a first trace connected to the light sources included in the first light source row, and a second trace connected to the light sources included in the second light source row. Resistance in the first trace is greater than resistance in the second trace.

DETAILED DESCRIPTION

In the following, an embodiment of the present disclosure will be specifically explained, with reference to the drawings. Note that in the following description, same reference numerals are affixed to same constituent elements or corresponding constituent elements throughout all the drawings, and any overlapping explanation therefor will be omitted.

First Embodiment

<Configuration of Liquid Discharging Apparatus>

Figure 1:
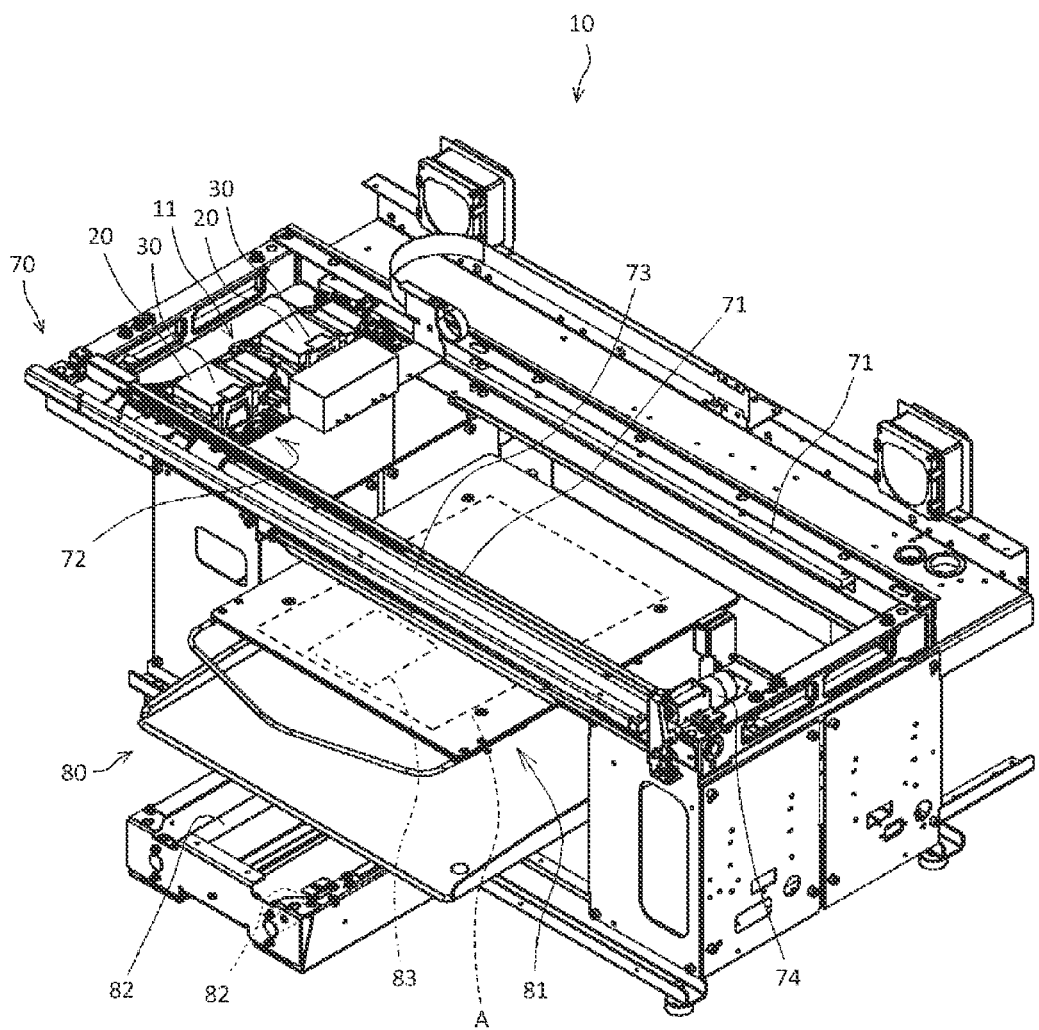
FIG. 1 is a perspective view of a liquid discharging apparatus provided with a light irradiator, depicting a state that a lid of a casing is opened.
Figure 1:
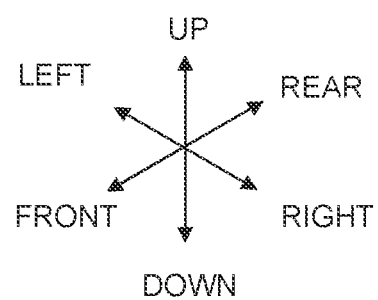
Figure 2:
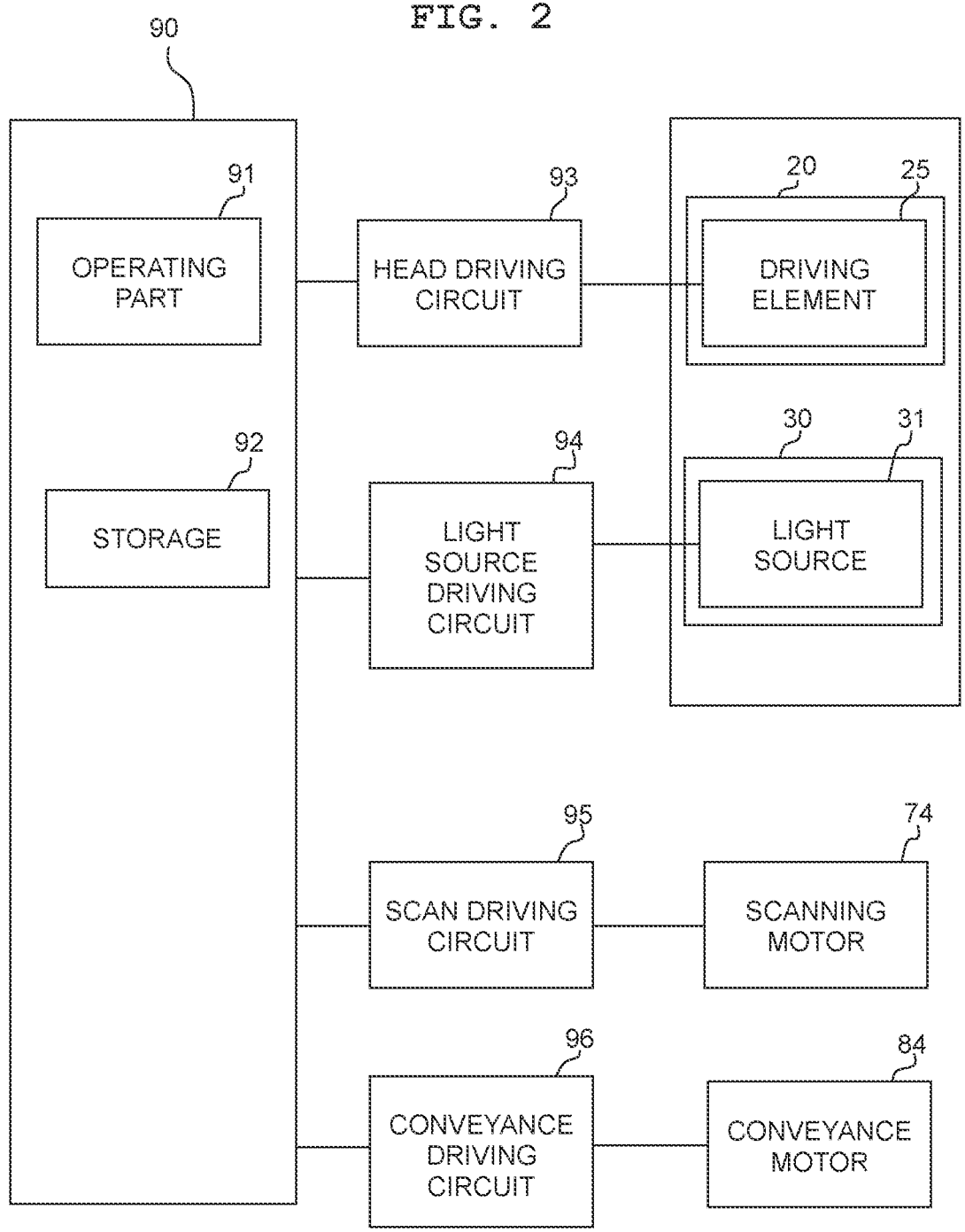
FIG. 2 is a functional block diagram depicting the configuration of the liquid discharging apparatus of FIG. 1.

A light irradiator 30 according to a first embodiment is, for example, provided on a liquid discharging apparatus 10. The liquid discharging apparatus 10 is an ink-jet printer. As depicted in FIG. 1, the liquid discharging apparatus 10 performs printing by discharging or ejecting a liquid such as an ink, etc., from a head 20 onto a median M and by irradiating, with a light, the liquid on the medium M from the light irradiator 30. The medium M includes, for example, a sheet-shaped medium such as fabric, paper, etc., and a three-dimensional medium such as a ball, a mug, etc. The liquid is photo-curable. The liquid discharging apparatus 10 is provided with a head unit 11, a scanning device 70, a conveyer 80 and a controller 90 (FIG. 2). The head unit 11 has the head 20 and the light irradiator 30. Note that the specifics of the head unit 11 and the controller 90 will be described later on.

Further, a first direction in which the medium M is conveyed by the conveyer 80 is referred to as a front-rear direction. A second direction crossing (for example, orthogonal to) the first direction is referred to as a left-right direction. A direction crossing (for example, orthogonal to) the front-rear direction and the left-right direction is referred to as an up-down direction. The arrangement of the liquid discharging apparatus 10, however, is not limited to or restricted by this.

The scanning device 70 has a pair of scanning rails 71, a carriage 72, a driving belt 73 and a scanning motor 74, and moves the head unit 11 in the left-right direction. The pair of scanning rails 71 are long members extending in the left-right direction, and arranged to be parallel to each other so as to interpose the head unit 11 therebetween. The carriage 72 has the head unit 11 mounted thereon, and is supported to be movable in the left-right direction along the pair of scanning rails 71. The driving belt 73 is stretched in the left-right direction, and is connected to the scanning motor 74. The scanning motor 74 drives the driving belt 73 to thereby move the carriage 72 reciprocally in the left-right direction along the pair of scanning rails 71.

The conveyer 80 has a stage 81, a pair of conveying rails 82, a stage supporting stand 83 and a conveyance motor 84 (FIG. 2), and moves the medium M in the front-rear direction. The stage 81 has a rectangular, flat shape; the medium M is placed on the upper surface of the stage 81, and the stage 81 defines a spacing distance in the up-down direction between the medium M and the head 20. The pair of conveying rails 82 extend in the front-rear direction, and supports the stage supporting stand 83 to be movable in the front-rear direction. The stage supporting stand 83 supports, for example, the stage 81 detachably and attachably, and is connected to the conveyance motor 84. The conveyance motor 84 drives the stage supporting stand 83 to thereby move the stage 81 in the front-rear direction.

<Configuration of Head Unit>

Figure 3A:
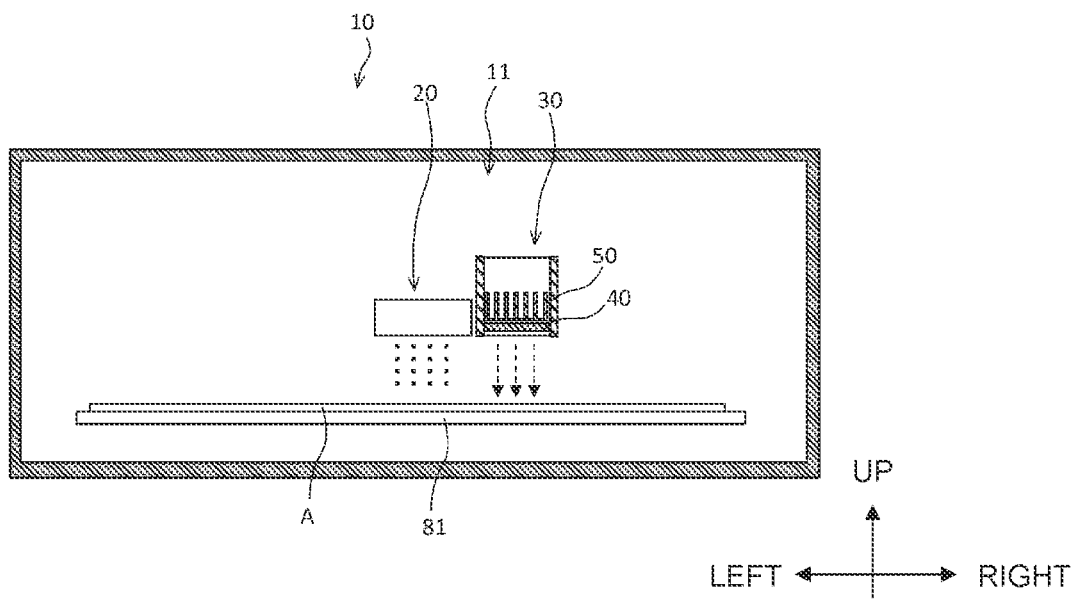
FIG. 3A is a view of a head unit of FIG. 1, as seen from a side thereof.
Figure 3B:
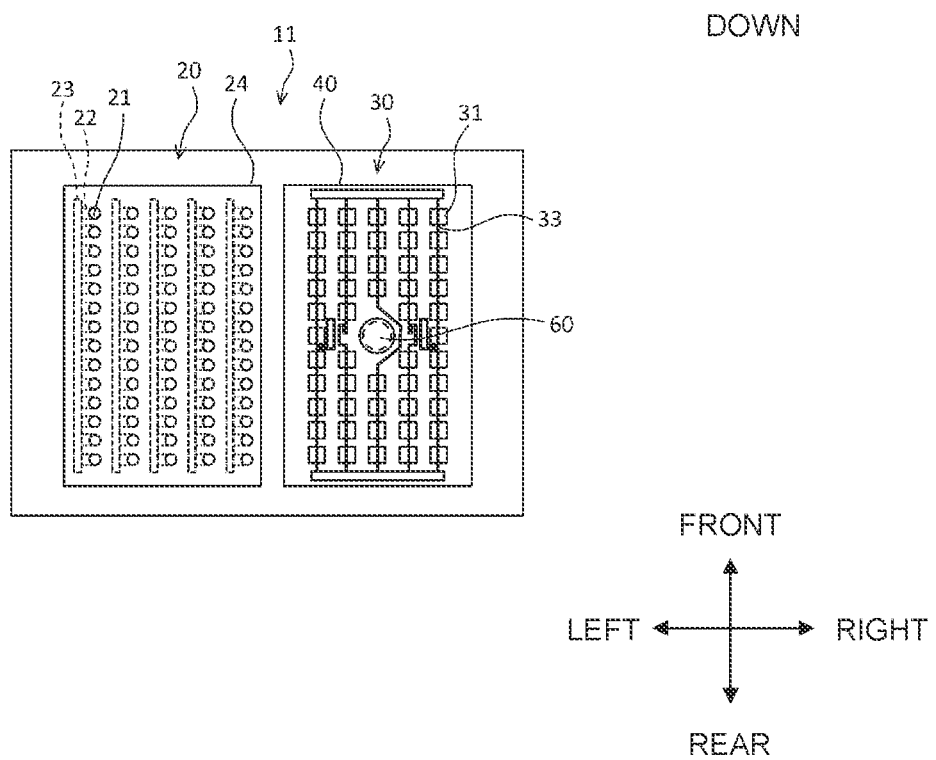
FIG. 3B is a view of the head unit of FIG. 3A, as seen therebelow.

As depicted in FIGS. 3A and 3B, the head 20 is arranged in the head unit 11 so that a lower surface of the head 20 and a lower surface of the light irradiator 30 face an upper surface of the stage 81. The head 20 has a plurality of nozzles 21, a plurality of individual channels 22, a common channel 23, a channel forming body 24 and a plurality of driving elements 25 (FIG. 2). The plurality of nozzles 21 are aligned in the front-rear direction with equal spacing distances therebetween so as to form a nozzle row (nozzle array). A plurality of pieces of the nozzle row are arranged side by side in the left-right direction with equal spacing distances therebetween.

The channel forming body 24 has, for example, a shape which is rectangular parallelepiped, and has the plurality of nozzles 21, the plurality of individual channels 22 and the common channel 23 formed therein. The plurality of nozzles 21 are opened in a lower surface of the channel forming body 24. The common channel 23 extends in the front-rear direction, and the plurality of individual channels 22 are branched from the common channel 23. Each of the plurality of individual channels 22 has an upstream end connected to the common channel 23, and a downstream end connected to one of the plurality of nozzles 21. Accordingly, the liquid flowing through the common channel 23 is branched into the plurality of individual channels 22 while flowing through the common channel 23 in the front-rear direction, and is supplied to the plurality of nozzles 21.

Each of the plurality of driving elements 25 is a piezo-electric element, etc., and is provided corresponding to one of the plurality of individual channels 22. Each of the plurality of driving elements 25 is driven by the controller 90 (FIG. 3) so as to change the volume of one of the plurality of individual channels 22. With this, a pressure for ejecting or discharging the liquid from the nozzle 21 is applied to the liquid in each of the plurality of individual channels 22.

The light irradiator 30 is arranged on the upstream of the head 20 which moves while discharging the liquid therefrom. For example, in unidirectional printing, the head 20 discharges the liquid in a case that the head 20 moves to the left side, and does not discharge the liquid in a case that the liquid moves to the right side. In this case, the light irradiator 30 is arranged on the right side which is the upstream side in a moving direction of the head 20 moving to the left side during the printing. The light irradiator 30 irradiates, with the light, the liquid on the medium M while the light irradiator 30 moves following the head 20 discharging the liquid onto the medium M.

Note that in bidirectional printing, the liquid discharging apparatus 10 has a pair of light irradiators 30 which are arranged to sandwich the head 20 in the left-right direction. A light irradiator 30, which is included in the pair of light irradiators 30 and which is on the right side, irradiates, with the light, the liquid on the medium M while moving to the left side following the head 20 discharging the liquid onto the medium M while moving to the left side. A light irradiator 30, which is included in the pair of light irradiators 30 and which is on the left side, irradiates, with the light, the liquid on the medium M while moving to the right side following the head 20 discharging the liquid onto the medium M while moving to the right side.

The light irradiator 30 has a plurality of light sources 31, a substrate 40 having the plurality of light sources 31 mounted thereon, a heat sink 50 configured to cool the substrate 40, and a fixing part 60 configured to fix the heat sink 50 to the substrate 40. Each of the plurality of light sources 31 is, for example, an LED, is driven by the controller 90 to emit a light (for example, ultraviolet ray) curing the liquid ejected or discharged from the nozzles 21 and landed on the medium A. Note that the details of the light irradiator 30 will be described later on.

<Configuration of Controller>

As depicted in FIG. 2, the controller 90 is connected to the plurality of driving elements 25 via a head driving circuit 93, and controls driving of the plurality of driving elements 25.

The controller 90 is connected to the plurality of light sources 31 via a light source driving circuit 94, and controls driving of the plurality of light sources 31. The light source driving circuit 94 is connected to an external power source such as a commercial power source (supply), etc., and controls power supply from the power sources to the plurality of light sources 31. The controller 90 is connected to the scanning motor 74 via a scan driving circuit 95, and controls driving of the scanning motor 74. The controller 90 is connected to the conveyance motor 84 via, a conveyance driving circuit 96, and controls driving of the conveyance motor 84.

The controller 90 has an operating part 91 and a storage 92. The storage 92 is a memory to which the operating part 91 is accessible, and is constructed of a RAM and a ROM, etc. The RAM temporarily stores a variety kinds of data such as a print job, etc. The ROM stores programs for performing a variety of kinds of data processing.

The operating part 91 is constructed of a processor such as a CPU, etc., and an integrated circuit such as an ASIC, etc. The operating part 91 executes a program stored in the ROM so as to control the plurality of driving elements 25, the plurality of light sources 31, the scanning motor 74 and the conveyance motor 84, thereby executing a print processing. The details of the print processing will be described later on.

<Printing Processing>

In the printing processing, the controller 90 controls the plurality of driving elements 25 to thereby execute a discharging processing of discharging (ejecting) the liquid from the head 20. Further, the controller 90 controls the plurality of light sources 31 to thereby execute an irradiating processing of irradiating (applying) the light from the light irradiator 30. Furthermore, the controller 90 controls the scanning motor 74 to thereby execute a moving processing of moving the head unit 11 in the left-right direction. Moreover, the controller 90 controls the conveyance motor 84 to thereby execute a conveying processing of conveying the medium M frontward. The controller 90 alternately repeats an image recording processing including the discharging processing, the irradiating processing and the moving processing, and the conveying processing so as to advances the printing processing.

In the image recording processing, the head 20 discharges or ejects the liquid from the plurality of nozzles 21, while the head 20 is moving to the left side. With this, the liquid lands on the medium M which faces or is opposite to the lower surface of the head 20. Further, the light irradiator 30 irradiates or applies the light from the plurality of light sources 31 while the light irradiator 30 is moving to the left side following the head 20. With this, the medium M facing the plurality of light sources 31 is irradiated with the light, and the liquid on the medium M is cured by the light, thereby fixing the liquid to the medium M.

<Light Irradiator>

Figure 4:
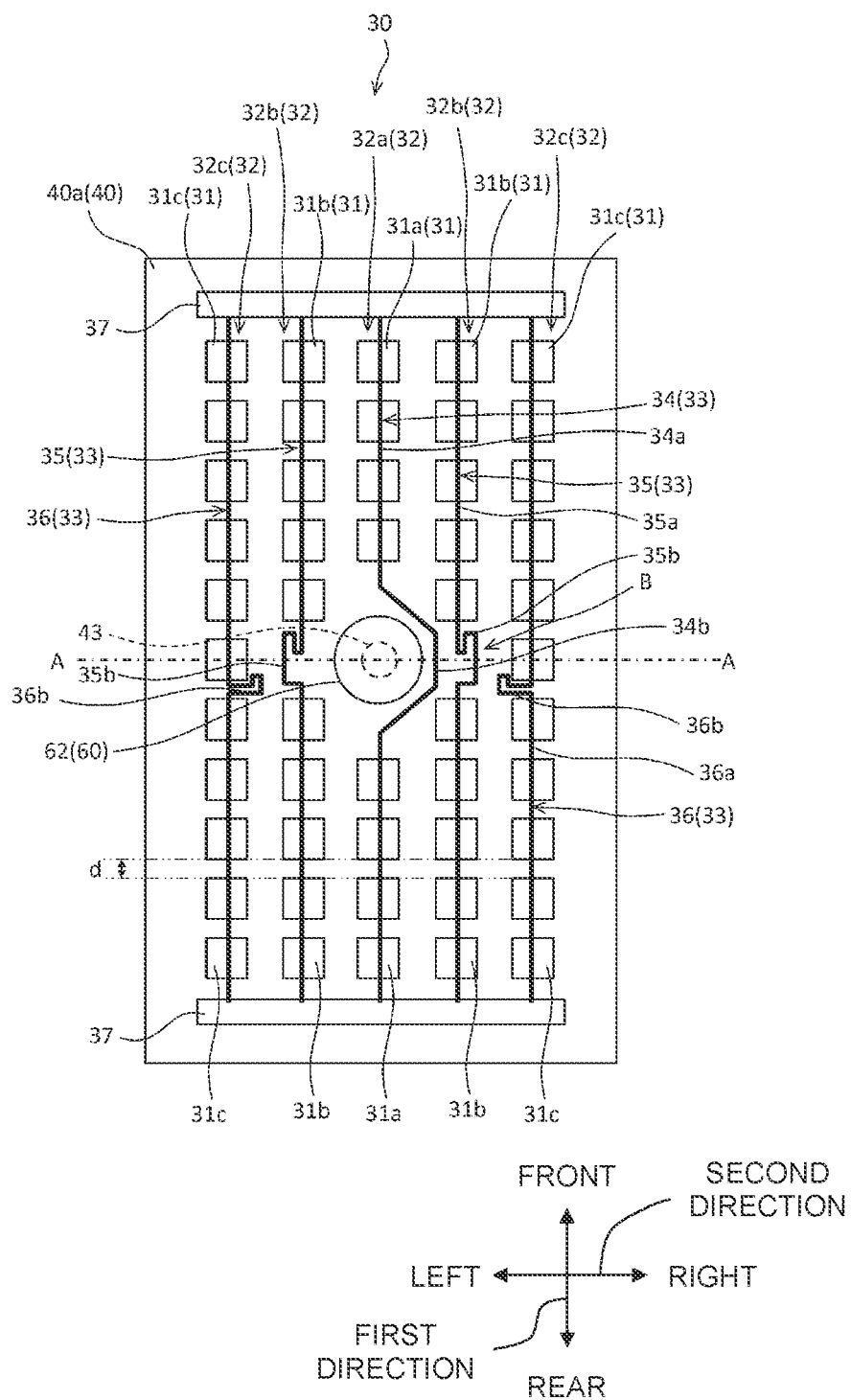
FIG. 4 is a view of the light irradiator of FIG. 3B, as seen from therebelow.
Figure 5:
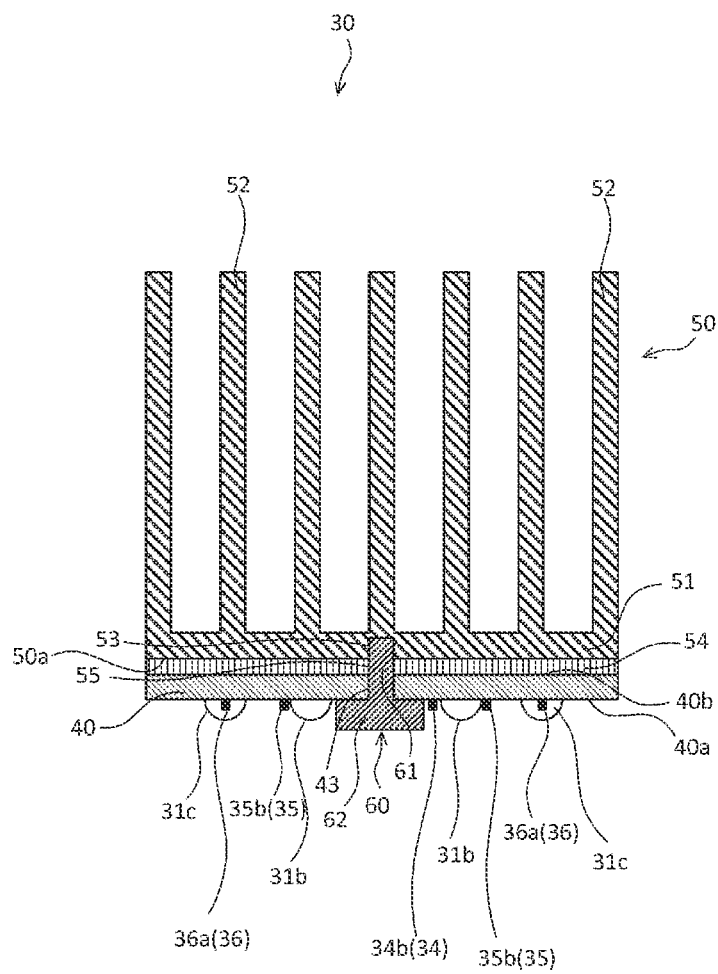
FIG. 5 is a cross-sectional view of the light irradiator taken along a V-V line of FIG. 4.
Figure 5:
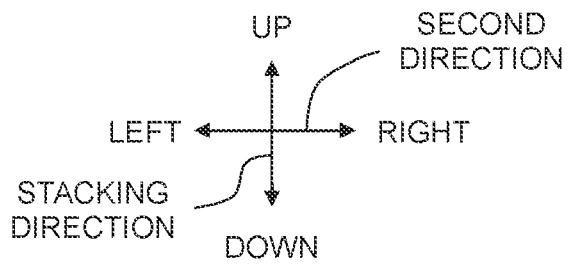
Figure 6:
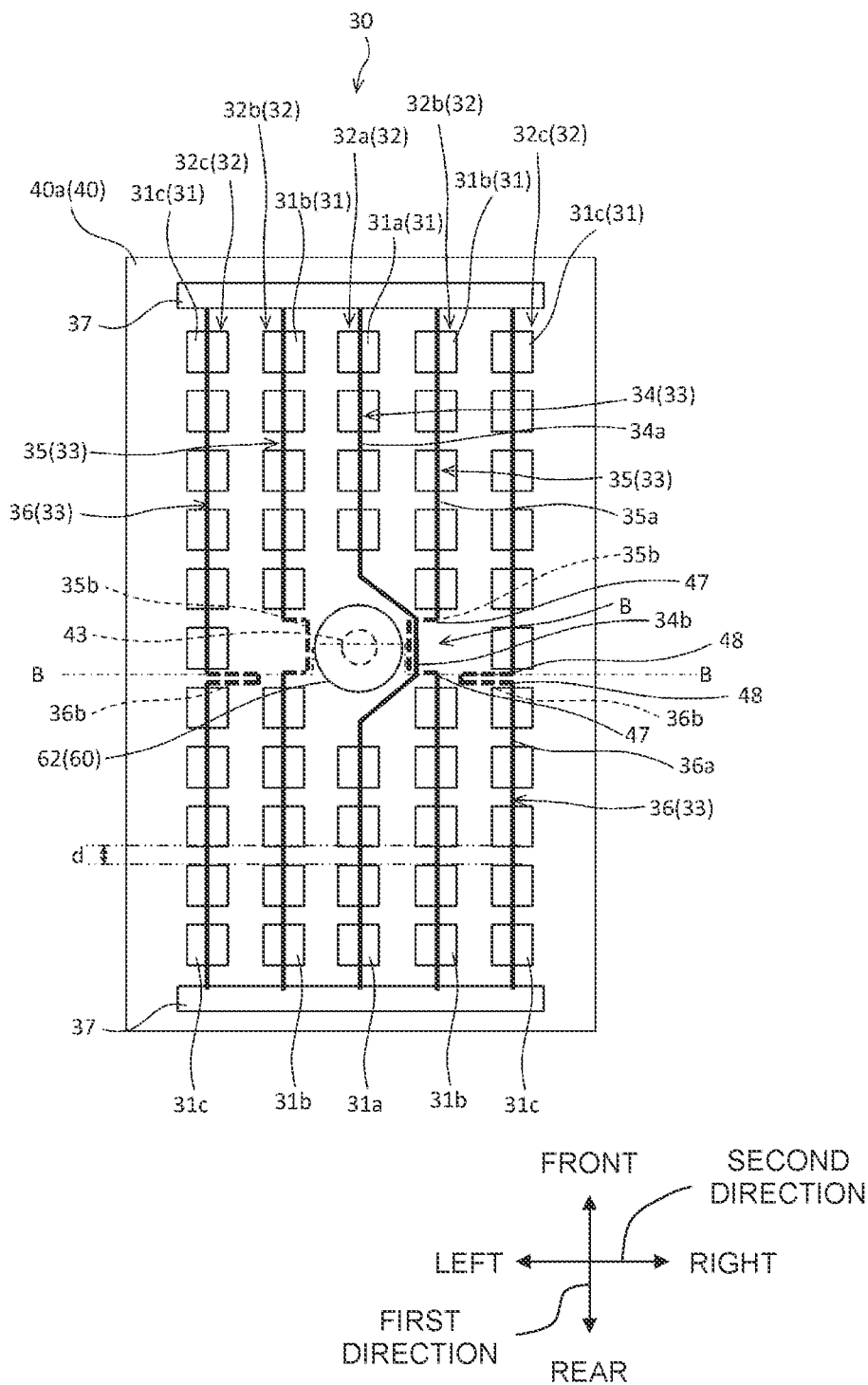
FIG. 6 is a view of a light irradiator, as seen from therebelow.

As depicted in FIGS. 4 and 5, the substrate 40 is formed, for example, of an insulating material, has a rectangular, flat plate-like shape in which a length in the front-rear direction is longer than a length in the left-right direction. The substrate 40 has a lower surface which is a front surface 40a having the plurality of light sources 31 mounted thereon, and an upper surface which is a back surface 40b on the opposite side to the front surface 40a. Both the lower surface and the upper surface are flat.

The substrate 40 has, fix example, a first through hole 43 formed in a center of the substrate 40. The first through hole 43 is a hole to which the fixing part 60 is attached and in which, for example, a cross section orthogonal to the up-down direction is circular, which extends in the up-down direction, and which penetrates both of the lower surface and the upper surface of the substrate 40.

The center of the substrate 40 is a position at which the heat of the plurality of light sources 31 easily concentrates, and is, for example, a range including a center, of the substrate 40, in a direction orthogonal to the up-down direction. Note that the center of the substrate 40 may be a center in the arrangement distribution of the plurality of light sources 31. For example, the center of the substrate 40 may be set at a position at which the number of light sources 31 included in the plurality of light sources 31 and located on the left side with respect to the first through hole 43 in the left-right direction and the number of light sources 31 included in the plurality of light sources 31 and located on the right side with respect to the first through hole 43 in the left-right direction becomes same, and at which the number of light sources 31 included in the plurality of light sources 31 and located on the front side with respect to the first through hole 43 in the from-rear direction and the number of light sources 31 included in the plurality of light sources 31 and located on the rear side with respect to the first through hole 43 in the front-rear direction becomes same. Alternatively, the center of the substrate 40 may be the center in the heat distribution of the plurality of light sources 31. For example, the center of the substrate 40 may be set in the lower surface, of the substrate 40, at a position thereof at which the illumination profile of the plurality of light sources 31 becomes to be of the maximum value.

The plurality of light sources 31, a trace 33 connected to the plurality of light sources 31, and a connector 37 connected to the trace 33 are mounted on the lower surface of the substrate 40. The plurality of light sources 31 are aligned in a row (array) in the front-rear direction with a predetermined spacing distance therebetween. In such a manner, the plurality of light sources 31 form a plurality of light source rows (arrays) 32. A plurality of light source rows 32 are arranged side by side in the left-right direction, with a spacing distance therebetween. As seen from one side toward the other side in the left-right direction, the plurality of light source rows 32 and the plurality of nozzle rows are arranged so as to overlap with one another. In an example depicted in FIG. 4, the plurality of light source rows 32 have a first light source row 32a, a second light source row 32b and a third light source row 32c.

The first light source row 32a is a light source row 32 which is the center row among five pieces of the light source row 32 arranged side by side in the left-right direction, and has a plurality of pieces (for example, 8 (eight) pieces) of a first light source 31a which are arranged side by side in the front-rear direction. In the first light source row 32a, the first through hole 43 is arranged in the center in the front-rear direction, for example, between a first light source 31a which is the fourth from the front and a first light source 31a which is the fifth from the front, and which are adjacent to each other.

The second light source row 32b is a light source row 32 which is adjacent to the first light source row 32a in the left-right direction, and has a left-side second light source row 32b which is adjacent to the left side of the first light source row 32a and a right-side second light source row 32b which is adjacent to the right side of the first light source row 32a. Each of the left-side and right-side second light source rows 32b has a plurality of pieces (for example, 10 (ten) pieces) of a second light source 31b which are arranged side by side in the front-rear direction. In the second light source row 32b, a space B is arranged in the center in the front-rear direction, for example, between a second light source 31*b* which is the fifth from the front and a second light source 31*b* which is the sixth from the front, and which are adjacent to each other. Further, the plurality of second light sources 31*b* constructing the second light source row 32*b* has a front-end second light source 31*b* arranged at a front end of the second light source row 32*b* and a rear-end second light source 31*b* arranged at a rear end of the second light source row 32*b*.

The third light source row 32*c* is a light source row 32 which is adjacent to the second light source row 32*b* in the left-right direction, and has a left-side third light source row 32*c* which is adjacent to the left side of the second light source row 32*b* and a right-side third light source row 32*c* which is adjacent to the right side of the second light source row 32*b*. The third light source row 32*c* has a plurality of pieces (for example, 11 (eleven) pieces) of a third light source 31*c* which are arranged side by side in the front-rear direction. The plurality of third light sources 31*c* constructing the third light source row 32*c* has a front-end third light source 31*c* arranged at a front end of the third light source row 32*c* and a rear-end third light source 31*c* arranged at a rear end of the third light source row 32*c*.

In such light source rows 32, the first light sources 31*a*, the second light sources 31*b* and the third light sources 31*c* are arranged to be overlap with one another as seen from the one side to the other side in the left-right direction. Further, the third light sources 31*c* are arranged with a predetermined spacing distance "d" therebetween in the front-rear direction.

Accordingly, four pieces of the first light source 31*a* in front of (on the front side of) the first through hole 43 are arranged with the predetermined spacing distance d therebetween in the front-rear direction, and four pieces of the first light source 31*a* behind (on the rear side of) the first through hole 43 are arranged with the predetermined spacing distance d therebetween in the front-rear direction. Further, five pieces of the second light source 31*b* in front of (on the front side of) the space B are arranged with the predetermined spacing distance d therebetween in the front-rear direction, and five pieces of the second light source 31*b* behind (on the rear side of) the space B are arranged with the predetermined spacing distance d therebetween in the front-rear direction.

Furthermore, the space B is arranged so as to overlap with the first through hole 43 as seen from the one side to the other side in the left-right direction. In the front-rear direction, the length of the space B is longer than the spacing distance d between the second light sources 31*b*.

The connector 37 is provide on the substrate 40, as connectors 37 which are arranged on the front side and on the rear side, respectively, of the light source rows 32. The connectors 37 are connected to the light source driving circuit 94 (FIG. 2) and to the trace 33. The electric power is supplied, by the light source driving circuit 94, to the plurality of light sources 31 connected to the trace 33 via the connectors 37.

The trace 33 extends in the front-rear direction, and is connected to the connector 37 on the front side at a front end of the trace 33, and is connected to the connector 37 on the rear side at a rear end of the trace 33. The trace 33 has a first trace 34 connected to the plurality of first light sources 31*a*, a second trace 35 connected to the plurality of second light sources 31*b*, and a third trace 36 connected to the plurality of third light sources 31*c*.

The first trace 34 has a first connecting part 34*a* and a first circumventing part 34*b*. The first connecting part 34*a* has a front-side first connecting part 34*a* on the front side of the first circumventing part 34*b* in the front-rear direction, and a rear-side first connecting part 34*a* on the rear side of the first circumventing part 34*b* in the front-rear direction. The front-side first connecting part 34*a* and the rear-side first connecting part 34*b* extend in the front-rear direction linearly with respect to each other on a same straight line. The front-side first connecting part 34*a* is connected in series to each of the four first light sources 34*a* located on the front side of the first through hole 43 in the first light source row 32*a*. The rear-side first connecting part 34*a* is connected in series to each of the four first light sources 34*a* located on the rear side of the first through hole 43 in the first light source row 32*a*.

The first circumventing part 34*b* extends in a direction different from the front-rear direction on the lower surface of the substrate 40, and circumvents the fixing part 60 attached to the first through hole 43. The first circumventing part 34*b* has a front end connected to a rear end of the front-side first connecting part 34*a*, and a rear end connected to a front end of the rear-side first connecting part 34*a*. The first circumventing part 34*b* is arranged between a first light source 31*a* which is the fourth from the front and a first light source 31*a* which is the fifth from the front and which are adjacent to each other so as to sandwich the first through hole 43 therebetween in the front-rear direction, and is arranged between the first connecting part 34*a* and the second light source row 32*b* in the left-right direction. In an example depicted in FIG. 4, the first circumventing part 34*b* extends linearly from the front-side first connecting part 34*b* rightward and rearward, on the left side of the right-side second light source row 32*b*, then extends linearly rearward, and further extends linearly leftward and rearward and is connected to the rear-side first connecting part 34*a*.

The second trace 35 has a second connecting part 35*a* and a second circumventing part 35*b*. The second connecting part 35*b* has a front-side second connecting part 35*a* on the front side of the second circumventing part 35*b* in the front-rear direction, and a rear-side second connecting part 35*a* on the rear side of the second circumventing part 35*b* in the front-rear direction. The front-side second connecting part 35*a* and the rear-side second connecting part 35*a* extend in the front-rear direction linearly with respect to each other on a same straight line. The front-side second connecting part 35*a* is connected in series to each of the five second light sources 31*b* located on the front side of the space B in the second light source row 32*b*. The rear-side second connecting part 35*a* is connected in series to each of the five second light sources 31*b* located on the rear side of the space B in the second light source row 32*b*.

The second circumventing part 35*b* has a front end connected to a rear end of the front-side second connecting part 35*a*, and a rear end connected to a front end of the rear-side second connecting part 35*a*. The second circumventing part 35*b* is arranged between a second light source 31*b* which is the fifth from the front and a second light source 31*b* which is the sixth from the front and which are adjacent to each other so as to sandwich the space B therebetween in the front-rear direction, and is arranged on a side opposite to the side of the first through hole 34 with respect to the second connecting part 35*a* in the left-right direction. In the example depicted in FIG. 4, the second circumventing part 35*b* of the second trace 35 on the right side projects to the right side with respect to the front-side second connecting part 35*a*, on the left side of the right-side third light source row 32*c*, bends frontward and then turns (changes the direction thereof) rearward, and is connected to the rear-side second connecting part 35a. The second circumventing part 35b of the second trace 35 on the left side projects to the left side with respect to the front-side second connecting part 35a, on the right side of the left-side third light source row 32c, bends frontward and then turns (changes the direction thereof) rearward, and is connected to the rear-side second connecting part 35a.

In such a manner, the second circumventing part 35b extends in a direction different from the front-rear direction on the lower surface of the substrate 40. Accordingly, the entire length of the second trace 35 between the front-end light source 31b and the rear-end second light source 31b is longer than the shortest distance of the second light source row 32b in the front-rear direction, by the second circumventing part 35b.

The third trace 36 has a third connecting part 36a and a third circumventing part 36b. The third connecting part 36b has a front-side third connecting part 36a on the front side of the third circumventing part 36b in the front-rear direction, and a rear-side third connecting part 36a on the rear side of the third circumventing part 36b in the front-rear direction. The front-side third connecting part 36a and the rear-side third connecting part 36b extend in the front-rear direction linearly with respect to each other on a same straight line. The front-side third connecting part 36a is connected in series to each of the six third first light sources 31c located on the front side of the third circumventing part 36b in the third light source row 32c. The rear-side third connecting part 36a is connected in series to each of the five third light sources 31c located on the rear side of the third circumventing part 36b in the third light source row 32b.

The third circumventing part 36b has a front end connected to a rear end of the front-side third connecting part 36a, and a rear end connected to a front end of the rear-end third connecting part 36a. The third circumventing part 36b is arranged between light sources 31 which are near to the center and which are adjacent in the front-rear direction, for example, between a third light source 31b which is the sixth from the front and a third light source 31b which is the seventh from the front, and is arranged on the side of the first through hole 34 with respect to the third connecting part 36a in the left-right direction. In the example depicted in FIG. 4, the third circumventing part 36b of the third trace 36 on the right side projects to the left side with respect to the front-side third connecting part 36a, on the right side of the right-side second light source row 32b, bends frontward and then turns rearward, and is connected to the rear-side third connecting part 36a. The third circumventing part 36b of the third trace 36 on the left side projects to the right side with respect to the front-side third connecting part 36a, on the left side of the left-side second light source row 32b, bends frontward and then turns rearward, and is connected to the rear-side third connecting part 36a.

In such a manner, the third circumventing part 36b extends in a direction different from the front-rear direction on the lower surface of the substrate 40. Accordingly, the entire length of the third trace 36 between the front-end light source 31c and the rear-end second light source 31c is longer than the shortest distance of the third light source row 32c in the front-rear direction, by the third circumventing part 36b.

Such first trace 34, second trace 35 and third trace 36 are formed of mutually same materials, respectively, and have cross sectional areas, respectively, which are same as one another. Accordingly, the first trace 34, the second trace 35 and the third trace 36 have a same electric resistance per unit length.

A number of the first light source 31a connected to the first trace 34 is smaller than a number of the second light source 35 connected to the second trace 35, and the number of the second light source 31b connected to the second trace 35 is smaller than a number of the third light source 31c connected to the third trace 36. Accordingly, combined resistance of all the first light sources 31a connected to the first trace 34 is smaller than combined resistance of all the second light sources 31b connected to the second trace 35; and the combined resistance of all the second light sources 31b connected to the second trace 35 is smaller than combined resistance of all the third light sources 31c connected to the third trace 36.

In contrast to this, the length of the first circumventing part 34b is longer than the length of the second circumventing part 35b, and the length of the second circumventing part 35b is longer than the length of the third circumventing part 36b. Accordingly, the electric resistance of the first trace 34 itself is greater than the electric resistance of the second trace part 35 itself, and the electric resistance of the second trace part 35 itself is greater than the electric resistance of the third trace part 36 itself.

Thus, the combined resistance of the first trace 34 and all the first light sources 31a connected to the first trace 34 and the combined resistance of the second trace 35 and all the second light sources 31b connected to the second trace 35 and the combined resistance of the third trace 36 and all the third light sources 31c connected to the third trace 36 are same as one another or close to one another. With this, it is possible to lower any unevenness in the illuminance among the light sources 31, even in a case that the number of the light sources 31 connected is different among the traces 33 due to the arrangement of the fixing part 60 and/or that the length is different among the traces 33 due to the circumvention in the traces 33.

The heat sink 50 is formed of a heat-conductive material. The heat-conductive material is exemplified by a metal or alloy such as aluminum, iron, copper, etc. The heat sink 50 has an attachment part 51 and a plurality of fins 52. The attachment part 51 has a flat-plate like shape, and has a lower surface as a facing surface 50a that faces or is opposite to the upper surface of the substrate 40, and an upper surface on a side opposite to the lower surface. The plurality of fins 52 are arranged at equal spacing distances therebetween in both of the front-rear direction and the left-right direction so that the distribution of the plurality of fins 52 in the attachment part 51 becomes uniform. Each of the plurality of fins 52 has a shape which is a circular column, a rectangular column, etc., and rises and extends upward from the upper surface of the attachment part 51.

A first screw hole 53 is provided on the attachment part 51 at a position corresponding to the first through hole 43 of the substrate 40. The first screw hole 53 is a hole to which the fixing part 60 is attached, and in which, for example, a cross section orthogonal to the up-down direction is circular, and which extends upward from the lower surface of the attachment part 51. A thread groove is provided on an inner surface, of the attachment part 51, which surrounds the first screw hole 53. Note that the first screw hole 53 may penetrate through both of the lower surface and the upper surface of the attachment part 51.

It is allowable that a heat conductive material 54 is sandwiched between the heat sink 50 and the substrate 40. The heat conductive material 54 has a flat plate-like shape, and has a lower surface facing the upper surface of the substrate 40 and an upper surface which is on a side opposite to the lower surface thereof and which faces the lower surface of the heat sink 50. The heat conductive material 54 fills minute or small gaps and a minute or small concavities and convexities between the substrate 40 and the heat sink 50, and transfers the heat of the substrate 40 to the heat sink 50. With this, it is possible to improve the cooling effect of the substrate 40 by the heat sink 50.

An insertion hole 55 is provided on the heat conductive material 54, at a position corresponding to the first through hole 43 of the substrate 40. The insertion hole 55 is a hole to which the fixing part 60 is attached, and in which, for example, a cross section orthogonal to the up-down direction is circular, and which extends in the up-down direction and penetrates both of the lower surface and the upper surface of the attachment part 51.

The fixing part 60 is formed, for example, of a material such as a metal, etc., of which thermal conductivity is higher than that of the substrate 40, and has a shaft part 61 and a head part 62. The shaft part 61 has, for example, a shape which is a circular column, and has a base end attached to the head part 62. The shaft part 61 is provided with a screw thread at least in a forward end area of the shaft part 61. The forward end area is an area, of the shaft part 61, which includes a forward end thereof, and is a range in which the shaft part 61 is inserted into the first screw hole 53. Note that the screw thread may be provided over the entire length between the base end and the forward end of the shaft part 61.

The head part 62 has, for example, a disc shape, and has a diameter which is greater than the diameter of the first through hole 43. With this, in a case that the shaft part 61 is inserted into the first through hole 43, the insertion hole 55 and the first screw hole 53 and is screwed into the first screw hole 53, the head part 62 abuts against (is brought into contact with) the lower surface of the substrate 40 and is locked thereto. Accordingly, the heat sink 50 is fixed, by the fixing part 60, to the substrate 40 via the heat conductive material 54. Further, the heat of the substrate 40 is propagated to the heat sink 50 via the heat conductive material 54 and the fixing part 60, thereby cooling the substrate 40.

The light irradiator 30 is provided with the plurality of light sources 31, the heat sink 50, the substrate 40 to which the plurality of light sources 31 are attached and which has the trace 33 connected to the plurality of light sources 31, and the fixing part 60 fixing the heat sink 50 to the substrate 40. The plurality of light sources 31 are aligned in the first direction so as to form the plurality of light source rows 32. The plurality of light source rows 32 have the first light source row 32a and the second light source row 32b which are arranged side by side in the second direction orthogonal to the first direction. The fixing part 60 is arranged between the light sources 31 included in the plurality of light sources 31 and which are adjacent to each other in the first light source row 32a, whereas the fixing part 60 is not arranged in the second light source row 32b. The traces 33 include the first trace 34 connected to the light sources 31 of the first light source row 32a, and the second trace 35 connected to the light sources 31 of the second light source row 32b. The first trace 34 has the first circumventing part 34b configured to circumvent the fixing part 60. The second trace 35 has the second circumventing part 35b configured to circumvent the fixing part 60 and having the directional component different from the first direction. With this, the electric current flowing through the second trace 35 consequently has, in the second circumventing part 35b, a directional component different from the first direction.

There is such a case that the length of the first trace 34 is made to be long due to the presence of the first circumventing part 34b so as to circumvent the fixing part 60, as described above. Even in such a case, the length of the second trace 35 is made to be long due to the presence of the second circumventing part 35b having the directional component different from the first direction. Accordingly, it is possible to lower any difference in the illuminance between the first light sources 31a and the second light sources 31b by making the combined resistance of all the second light sources 31b and the second trace 35 to coincide with or approach the combined resistance of all the first light sources 31a and the first trace 34.

In the light irradiator 30, the second light source row 32b includes a one-end light source 31 at one end in the first direction, and the other-end light source 31 at the other end in the first direction. The second circumventing part 35b is arranged, in the first direction, between the one-end light source 31 and the other-end light source 31. For example, since the second circumventing part 35b is arranged between the front-end light source 31b and the rear-end light source 31b, it is possible to suppress any increase in the size of the substrate 40 in the front-rear direction due to the presence of the second circumventing part 35b.

In the light irradiator 30, the third trace 36 has the third connecting part 36a connected to the third light sources 31c of the third light source row 32c and extending in the first direction. The third circumventing part 36b is provided at the position which is closer to the fixing part 60 than the third connecting part 36a. Namely, in the left-right direction, a connecting position, in the third circumventing part 36b, with respect to the third connecting part 36a (for example, the front end of the third circumventing part 36b) is located to be closer to the side of the fixing part 60 than a connecting position, in the connecting part 36a, with respect to the third circumventing part 36b (for example, the rear end of the front-side third connecting part 36a). Accordingly, in the left-right direction, a spacing distance between the front end of the third circumventing part 36b and the fixing part 60 is shorter than a spacing distance between the rear end of the front-side third connecting part 36a and the fixing part 60. As described above, in the left-right direction, the spacing distance between the third circumventing part 36b and the fixing part 60 is smaller than the spacing distance between the third connecting part 36a and the fixing part 60. With this, the third trace 36 is capable of releasing the heat to the heat sink 50 via the third circumventing part 36b and the fixing part 60.

In the light irradiator 30, the substrate 40 has the front surface 40a to which the plurality of light sources 31 are attached. The second circumventing part 35b is provided on the space B on the front surface 40a and between the adjacent light sources 31 which are arranged side by side with the fixing part 60 in the second direction and which are adjacent to each other in the first direction in the second light source row 32b. With this, the space B between the adjacent light sources 31 provided so as to circumvent the fixing part 60 in the second light source row 32b can be used as an arranging location for the second circumventing part 35b, thereby making it possible to suppress any increase in the size due to the presence of the second circumventing part 35b.

In the light irradiator 30, in the second light source row 32b, the spacing distance between the light sources 31 which are adjacent to each other with the spacing B being interposed therebetween is wider than the spacing distance between the light sources 31 which are adjacent to each other on one side in the first direction with respect to the space B. With this, the second circumventing part 36b is arranged in the space B which is between the light sources 31 and which is provided so as to circumvent the fixing part 60 in the second light source row 32b, thereby making it possible to suppress any increase in the size due to the presence of the second circumventing part 35b.

In the light irradiator 30, the number of the light source 31 in the first light source row 32a is smaller than the number of the light source 31 in the second light source row 32b. The trace 33 has the first trace 34 connected to the light sources 31 of the first light source row 32a, and the second trace 35 connected to the light sources 31 of the second light source row 32b. The electric resistance of the first trace 34 is greater than the electric resistance of the second trace part 35. As described above, by making the electric resistance of the first writing 34 in which the number of the light source 31 connected thereto is small to be greater than the electric resistance of the second trace part 35 in which the number of the light source 31 connected thereto is great, it is possible to make the electric current flowing in the first light source 31a by the first trace 34 and the electric current flowing in the second light source 31b by the second trace 35 to approach each other, thereby making it possible to lower any difference in the illuminance between the light sources 31.

The liquid discharging apparatus 10 is provided with: the light irradiator 30; the head 20 configured to discharge or eject, to the medium M, the liquid which is curable by the light irradiated from the light irradiator 30; and the conveyer 80 configured to convey the medium M in the conveying direction parallel to the first direction. With this, the liquid discharging apparatus 10 is capable of lowering any unevenness (variation) in illuminance among the plurality of light sources 31 due to the light irradiator 30, thereby making it possible to perform the printing satisfactorily.

The liquid discharging apparatus 10 is provided with the carriage 72 configured to move the head 20 in the orthogonal direction to the conveying direction. With this, also in the liquid discharging apparatus 10 in which the head 20 is moved in the orthogonal direction, it is possible to lower any unevenness (variation) illuminance among the plurality of light sources 31 due to the light irradiator 30, thereby making it possible to perform the printing satisfactorily.

Second Embodiment

In a light irradiator 30 according to a second embodiment, the substrate 40 has a plurality of layers stacked in a stacking direction orthogonal to the first direction and the second direction. The first circumventing part 34b and the second circumventing part 35b are provided on mutually different layers, respectively. Here, the second circumventing part 35b may circumvent the fixing part 60 in the stacking direction.

Further, the substrate 40 may have a not less than three layers as the plurality of layers. Here, the light source rows 32 have the third light row 32c which is adjacent to the second light row 32b in the second direction, and in which the fixing part 60 is not arranged therein. The trace 33 has the third trace 36 connected to the light sources 31 of the third light source row 32c. The third trace 36 has the third circumventing part 36b having a directional component different from the first direction. The second circumventing part 35b and the third circumventing part 36b are provided on mutually different layers, respectively.

Specifically, the substrate 40 is a stacked body of the plurality of (for example, three) layers. The three layers have a first layer 44, a second layer 45 stacked on the first layer 44, and a third layer 46 stacked on the second layer 45. A first lower surface which is the lower surface of the first layer 44 constructs the front surface 40a of the substrate 40, and the plurality of light sources 31 are mounted on the first lower surface. A third upper surface which is the upper surface of the third layer 46 constructs a back surface 40b of the substrate 40, and the heat sink 50 is attached to the third upper surface via the heat conductive material 54.

A front-side connector 37, a rear-side connector 37, a second trace hole 47 and a third trace hole 48 are provided on the substrate 40. The second trace hole 47 is a hole through which the second trace 35 passes, and is provided as two second trace holes 47 in the second light source row 32b. The two second trace holes 47 are arranged in the space B of the second light source row 32b, with a spacing distance therebetween in the front-rear direction. The two second trace holes 47 are arranged on a same straight line with respect to the second connecting part 35a in the front-rear direction, and penetrate the first layer 44 in the up-down direction.

The third trace hole 48 is a hole through which the third trace 36 passes, and is provided as two third trace holes 48 in the third light source row 32c. The two third trace holes 48 are arranged between third light sources 31c which are included in the third light sources 31c constructing the third light source row 32c and which are adjacent in the front-rear direction, with a spacing distance therebetween in the front-rear direction. The two third trace holes 48 are arranged on a same straight line with respect to the third connecting part 36a in the front-rear direction, and penetrate the first layer 44 and the second layer 45 in the up-down direction.

The first connecting part 34a of the first trace 34 extends in the front-rear direction while being connected, on the first lower surface, to each of the first light sources 31a of the first light source row 32a. The first circumventing part 34b extends, for example, to protrude to the right side from the first connecting part 34a on the first lower surface, and circumvents the fixing part 60.

The second connecting part 35a of the second trace 35 extends, on the first lower surface, in the front-rear direction while being connected to each of the second light sources 31b of the second light source row 32b. The second circumventing part 35b is connected to the front-side second connecting part 35a, extends from the first lower surface upwardly in a front-side second trace hole 47 which is included in the two second trace holes 47 and which is on the front side, passes through the first layer 44, and reaches the first upper surface Which is the upper surface of the first layer 44. The second circumventing part 35b extends, between the first upper surface and the second lower surface, which is the lower surface, of the second layer 45, facing or opposite to the first upper surface, toward the side of the fixing part 60 and then bends rearward, then further bends to a side opposite to the fixing part 60. Then, the second circumventing part 35b extends downwardly in a rear-side second trace hole 47 which is included the two second trace holes 47 and which is on the rear side, passes through the first layer 44, and reaches the first lower surface of the first layer 44, and is connected to the rear-side second connecting pan 35a.

The third connecting part 36a of the second trace 36 extends, on the first lower surface, in the front-rear direction while being connected to each of the third light sources 31c of the third light source row 32c. The third circumventing part 36b is connected to the front-side third connecting part 36a, extends from the first lower surface upwardly in a front-side third trace hole 48 which is included in the two third trace holes 48 and which is on the front side, passes through the first layer 44 and the second layer 45, and reaches the second upper surface which is the upper surface of the second layer 45. The third circumventing part 36*b* extends, between the second upper surface and the third lower surface, which is the lower surface, of the third layer 46, facing or opposite to the second upper surface, toward the side of the fixing pan 60 and then bends rearward, then further bends to a side opposite to the fixing part 60. Then, the third circumventing part 36*b* extends downwardly in a rear-side third trace hole 48 which is included in the two third trace holes 48 and which is on the rear side, penetrates the first layer 44 and the second layer 45, and reaches the first lower surface of the first layer 44, and is connected to the rear-side third connecting part 36*a*.

As described above, the length of the first circumventing part 34*b* is longer than the length of the second circumventing part 35*b*, and the length of the second circumventing part 35*b* is longer than the length of the third circumventing pan 36*b*. Accordingly, the electric resistance of the first trace 34 itself is greater than the electric resistance of the second trace part 35 itself, and the electric resistance of the second trace part 35 itself is greater than the electric resistance of the third trace part 36 itself. Thus, the combined resistance of the first trace 34 and all the first light sources 31*a* connected to the first trace 34 and the combined resistance of the second trace 35 and all the second light sources 31*b* connected to the second trace 35 and the combined resistance of the third trace 36 and all the third light sources 31*c* connected to the third trace 36 are same as one another or close to one another. With this, it is possible to lower any unevenness in the illuminance among the plurality of light sources 31, even in a case that the number of the light sources 31 connected is different among the traces 33 due to the arrangement of the fixing part 60 and/or that the length is different among the traces 33 due to the circumvention in the traces 33.

Further, the first circumventing part 34*b* and the second circumventing part 35*b* are provided, on the substrate 40, at the mutually different layers, respectively. With this, it is possible to improve the freedom of arrangement of the traces 33, while suppressing any increase in the size of the light irradiator 30 in a direction orthogonal to the stacking direction. For example, it is possible to arrange the first circumventing part 34*b* and the second circumventing part 35*b* to overlap with each other, as seen from one side to the other side of the stacking direction. Furthermore, regarding the configuration wherein the second circumventing part 35*b* and the third circumventing part 36*b* are provided, on the substrate 40, at the mutually different layers, respectively, it is possible to improve the freedom of arrangement of the traces 33, while suppressing any increase in the size of the light irradiator 30 in a direction orthogonal to the stacking direction.

Moreover, the second circumventing part 35*b* of the second trace 35 extends from the second connecting part 35*a* toward the side of the fixing part 60, and is provided at a location closer to the fixing part 60 than the second connecting part 35*a*, Namely, in the left-right direction, a connecting position of the second circumventing part 35*b* at which the second circumventing part 35*b* is connected to the second connecting part 35*a* (for example, a front end of the second circumventing part 35*b*) is located closer to the side of the fixing part 60, than a connecting position of the second connecting part 35*a* at which the second connecting part 35*a* is connected to the second circumventing part 35*b* (for example, a rear end of the front-side second connecting part 35*a*). Accordingly, in the left-right direction, a spacing distance between the front end of the second circumventing part 35*b* and the fixing part 60 is shorter than a spacing distance between the rear end of the front-side second connecting part 35*a* and the fixing part 60. As described above, in the left-right direction, the spacing distance between the second circumventing part 35*b* and the fixing part 60 is smaller than the spacing distance between the second connecting part 35*a* and the fixing part 60. With this, the heat propagated from the second light sources 31*b* to the second trace 35 is easily transferred to the heat sink 50 via the fixing part 60, thereby making it possible to efficiently cool the substrate 40. Note that by allowing the third circumventing part 36*b* to extend to the side of the fixing part 60 more than the third, circumventing part 36*a*, thereby making it also possible to enhance the efficiently of the coiling effect for the substrate 40.

Figure 7:
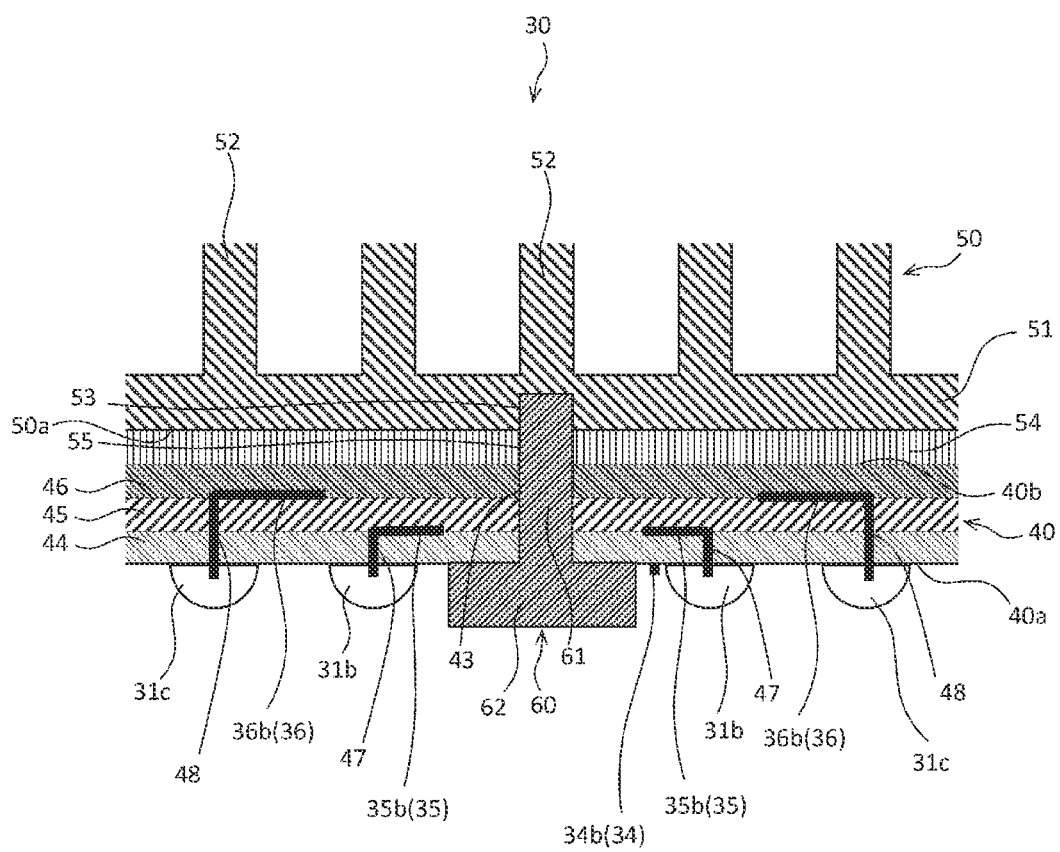
FIG. 7 is a cross-sectional view of the light irradiator taken along a line of FIG. 6.
Figure 7:
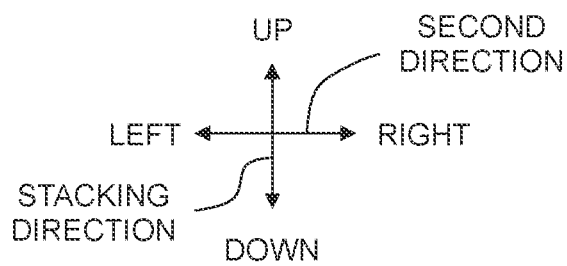

Note that in the example depicted in FIG. 7, the first circumventing part 34*b* is provided on the first lower surface, the second circumventing part 35*b* is provided on an inner layer between the first upper surface and the second lower surface, and the third circumventing part 36*b* is provided an inner layer between the second upper surface and the third lower surface. However, the arrangement of the first circumventing part 34*b*, the second circumventing part 35*b* and the third circumventing part 36*b* in the substrate 40 are not limited to or restricted by this. For example, it is also allowable that the first circumventing part 34*b* is arranged in the inner layer, and that the second circumventing part 35*b* is arranged in the first lower surface. Alternatively, it is also allowable that the first circumventing part 34*b* and the third circumventing part 36*b* are arranged in a same certain layer, and that the second circumventing part 35*b* is arranged in an inner layer which is different from the certain inner layer.

First Modification

Figure 8:
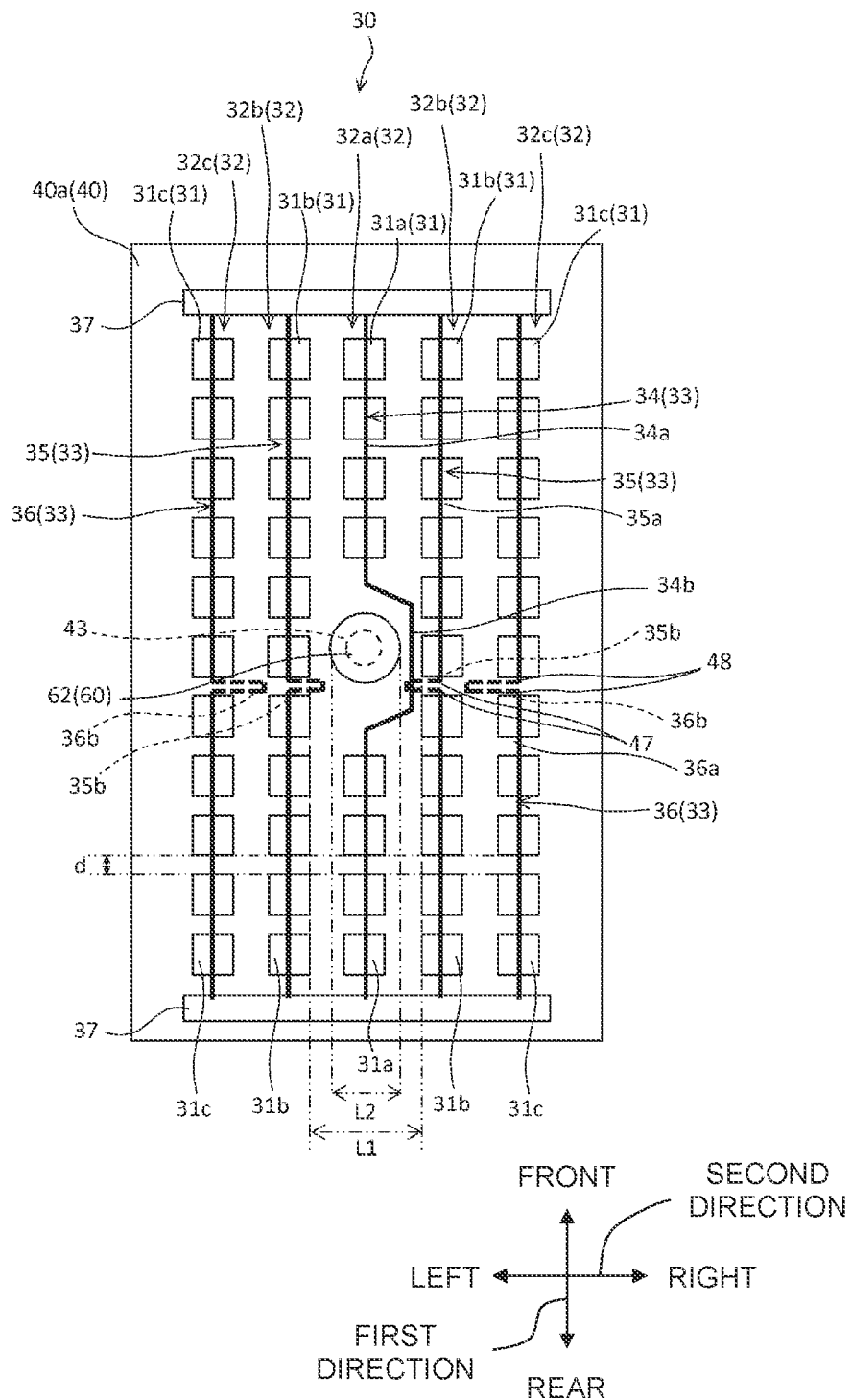
FIG. 8 is a view of a light irradiator, as seen from therebelow.

In a light irradiator 30 according to a first modification, the light sources 31 included in the second light source row 32*b* are arranged at mutually equal spacing distances therebetween in the first direction, as depicted in FIG. 8.

For example, in the left-right direction, a spacing distance L1 between the left-side second light source row 32*b* and the right-side second light source row 32*b* which are adjacent with the first light source row 32*a* being interposed therebetween is greater than a total length which is a total of a diameter L2 of the fixing part 60*a* and a length of a trace-arrangement space for the first circumventing part 34*b*. In such a case, there is no need that the second light source row 31*b* is provided with the space B (FIG. 4) for circumventing the fixing part 60. Accordingly, in the second light source row 32*b*, second light sources 31*b*, among the plurality of light sources 31*b*, which are adjacent to each other in the front-rear direction are aligned at a predetermined spacing distance "d". The two second trace holes 47 are arranged, with a spacing distance therebetween, on a same straight line with respect to the second connecting part 35*a* in the front-rear direction, between second light sources 31*b*, among the second light sources 31*b*, which are adjacent to each other in the front-rear direction.

The front-side connecting part 35*a* of the second trace part 35 extends, on the first lower surface, in the front-rear direction, while being connected to each of six second light sources 31*b* which are included in the second light sources 31*b* and which are located on the front side with respect to the second circumventing part 35*b*. The rear-side connecting part 35*a* of the second trace part 35 extends, on the first lower surface, in the front-rear direction, while being connected to each of five second light sources 31*b* which are included in the second light sources 31*b* and which are located on the rear side with respect to the second circumventing part 35*b*.

The second circumventing part 35*b* extends, in the front-side second trace hole 47, upwardly from the front-side second connecting part 35*a*, passes the front-side second trace hole 47 from the first lower surface and reaches the first upper surface. The second circumventing part 35*b* extends, between the first upper surface and the second lower surface, toward the side of the fixing part 60 and then bends rearward, then further bends to a side opposite to the fixing part 60. Then, the second circumventing part 35*b* passes the rear-side second trace hole 47, reaches the first lower surface, and is connected to the rear-side second connecting part 35*a*.

In such a case that the space B is not provided as described above, the second circumventing part 35*b* extends to be long in the left-right direction. Accordingly, there is such a case that the second circumventing part 35*b* is arranged to overlap with the first circumventing part 34. Also in such a case, by arranging the first circumventing part 34*b* and the second circumventing part 35*b* in the different layers, respectively, in the substrate 40, it is possible to arrange the first circumventing part 34*b* and the second circumventing part 35*b* without any interference between first circumventing part 34*b* and the second circumventing part 35*b*.

Second Modification

Figure 9:
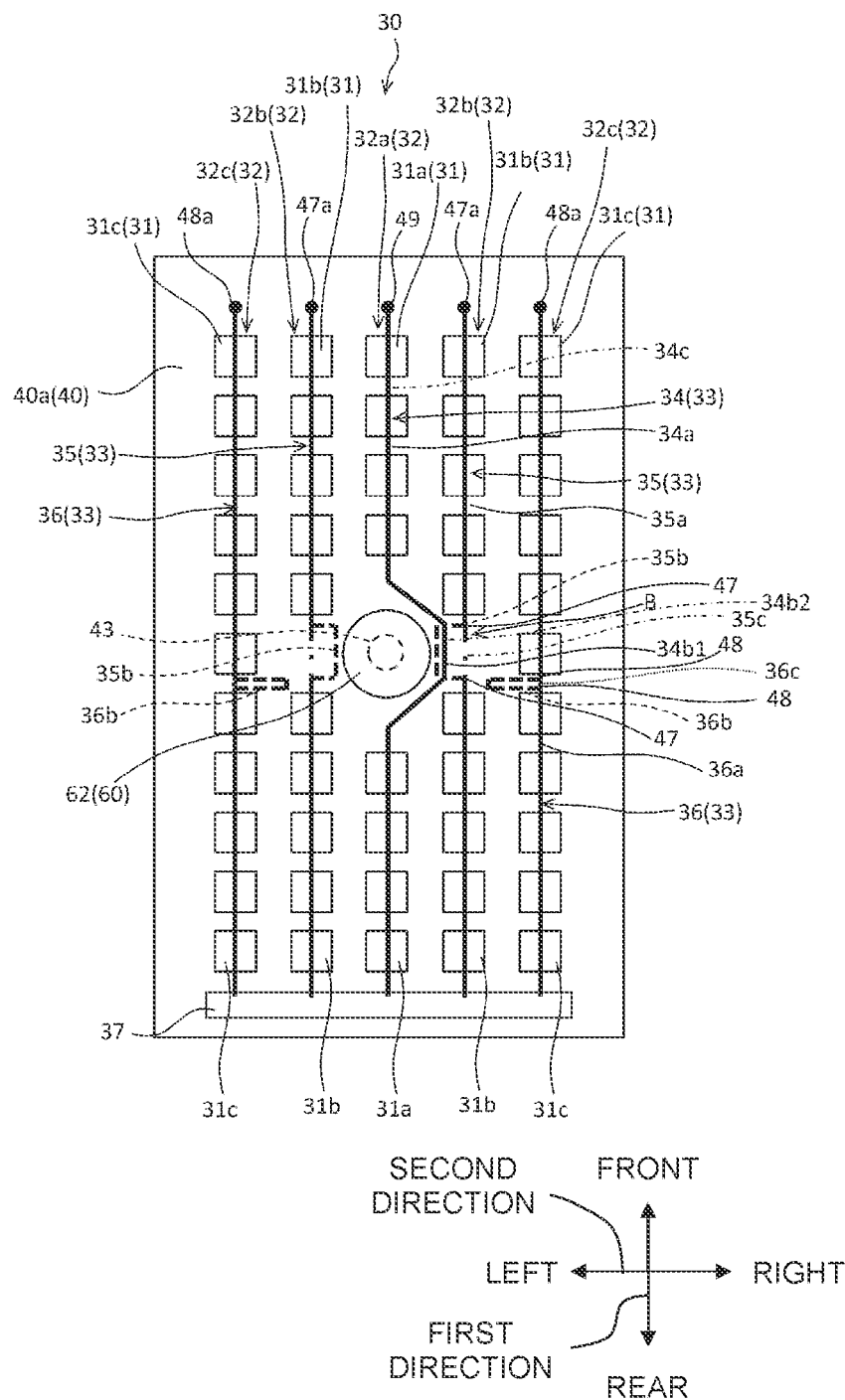
FIG. 9 is a view of a light irradiator, as seen from therebelow.

In a light irradiator 30 according to a second modification, the connector 33 connected to the traces 33 is provided either one of the both sides in the front-rear direction, as depicted in FIG. 9. In an example depicted in FIG. 9, the connector 37 is provided on the substrate 40 at a location thereof on the rear side of the traces 33, extends in the stacking direction, and are connected to both ends of the traces 33. Further, the connector 37 is connected to the light source driving circuit 94 (FIG. 2), and the electric power is supplied, by the light source driving circuit 94, to the plurality of light sources 31 via the connector 37.

In addition to the second trace hole 47 and the third trace hole 48, a first trace hole 49 is provided on the substrate 40. Further, the second trace hole 47 has a second trace hole 47*a* for allowing the second trace 35 to turn around in addition to the hole(s) through which the second circumventing part 35*b* passes. The third trace hole 48 has a third trace hole 48*a* for allowing the third trace 36 to turn around, in addition to the hole(s) through which the third circumventing part 36*b* passes. The first trace hole 49, the second trace hole 47*a* and the third trace hole 48*a* are arranged in a same straight line in the left-right direction.

The first trace hole 49 is a hole through which the first trace 34 passes, and is provided in the first light source row 32*a*. The first trace hole 49 is arranged on a same straight line with the first connecting part 34*a* in the front-rear direction, and penetrates the first layer 44 in the up-down direction. The first trace 34 has a first retuning part 34*c*, in addition to the first connecting part 34*a* and the first circumventing part 34*b*. The first circumventing part 34*b* has a first circumventing part 34*b*1 on the first lower surface of the first layer 44, and a first circumventing part 34*b*2 between the first layer 44 and the second layer 45, The first returning part 34*c* has a front-side first returning part 34*c*1 which is on the front side with respect to the first circumventing part 34*b*2, and a rear-side first returning part 34*c*2 which is on the rear side with respect to the first circumventing part 34*b*2.

The first trace 34 is connected, on the first lower surface, to the connector 37 and the first light sources 31*a* by the rear-side first connecting part 34*a*, circumvents the fixing part 60 by the first circumventing part 34*b*1, and is connected to the first light sources 31*a* by the front-side first connecting part 34*a*. Further, the front-side returning part 34*c*1 is connected to the front-side first connecting part 34*a*, passes the first trace hole 49, and extends from the front side toward the rear side between the first layer 44 and the second layer 45. The first circumventing portion 34*b*2 is connected to the front-side first returning part 34*c*1, circumvents the fixing part 60, and is connected to the rear-side first returning part 34*c*2. The rear-side first returning part 34*c*2 extends from the front side toward the rear side, and is connected to the connector 37.

The second trace hole 47*a* is a hole through which the second trace 35 passes, and is provided as second trace holes 47*a* each of which is provided on one of the second light source rows 32*b*, Each of the second trace holes 47 is arranged on a same straight line with the second connecting part 35*a* in the front-rear direction, and penetrates the first layer 44 in the up-down direction. The second trace 35 has a second retuning part 35*c*, in addition to the second connecting part 35*a* and the second circumventing part 35*b*.

The second trace 35 is connected, on the first lower surface, to the connector 37 and the second light sources 31*b* by the rear-side second connecting part 35*a*, circumvents the fixing part 60 by the second circumventing part 35*b* in the space B, and is connected to the second light sources 31*a* by the front-side second connecting part 35*a*. The second returning part 35*c* is connected to the front-side second connecting part 35*a*, passes the second trace hole 47*a*, extends linearly from the front side toward the rear side between the first layer 44 and the second layer 45, and is connected to the connector 37.

The third trace hole 48*a* is a hole through which the third trace 36 passes, and is provided as third trace holes 48*a* each of which is provided on one of the third light source rows 32*c*. Each of the third trace holes 48 is arranged on a same straight line with the third connecting part 36*a* in the front-rear direction, and penetrates the first layer 44 and the second layer 45 in the up-down direction. The third trace 36 has a third retuning part 36*c*, in addition to the third connecting part 36*a* and the third circumventing part 36*b*. The third trace 36 is connected, on the first lower surface, to the connector 37 and the third light sources 31*c* by the rear-side third connecting part 36*a*, circumvents the fixing part 60 by the third circumventing part 36*b*, and is connected to the third light sources 31*c* by the front-side third connecting part 36*a*. Further, the third returning part 36*c* is connected to the front-side third connecting part 36*a*, passes the third trace hole 48*a*, extends linearly from the front side toward the rear side between the second layer 45 and the third layer 46, and is connected to the connector 37.

The length of the second circumventing part 35*b* is determined so that the electric resistance of the second trace 35 based on the number of the second light sources 31*b* connected to the second trace 35 and the entire length of the second trace 35 is same as or close to the electric resistance of the first trace 34 based on the number of the first light sources 31*a* connected to the first trace 34 and the entire length of the first trace 34, Further, length of the third circumventing part 36*b* is determined so that the electric resistance of the third trace 36 based on the number of the third light sources 31*c* connected to the third trace 36 and the entire length of the third trace 36 is same as or close to the electric resistance of the first trace 34 based on the number of the first light sources 31a connected to the first trace 34 and the entire length of the first trace 34. With this, it is possible to suppress any unevenness in the illuminance among the first light sources 31a, the second light sources 31b and the third light sources 31c, while suppressing any increase in the size thereof in the direction orthogonal to the stacking direction.

Note that it is allowable that the first trace hole 49 penetrates through the first layer 44 and the second layer 45, and that the first returning part 34c is arranged between the second layer 45 and the third layer 46. Alternatively, it is allowable that the second trace hole 47a penetrates through the first layer 44 and the second layer 45, and that the second returning part 35c is arranged between the second layer 45 and the third layer 46. Still alternatively, it is allowable that the third trace hole 48a penetrates through the first layer 44, and that the third returning part 36c is arranged between the first layer 44 and the second layer 45.

Third Modification

Figure 10A:
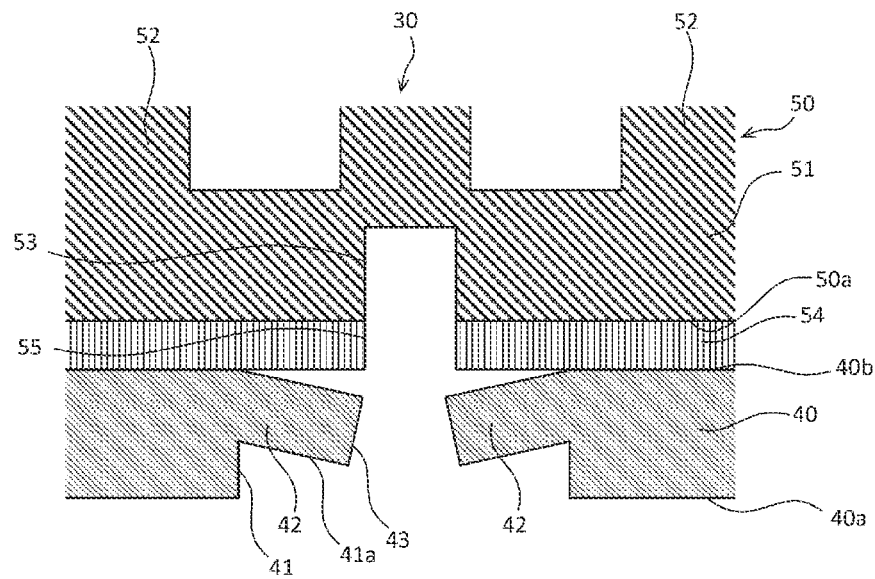
FIG. 10A is a cross-sectional view of a part of a light irradiator.
Figure 10B:
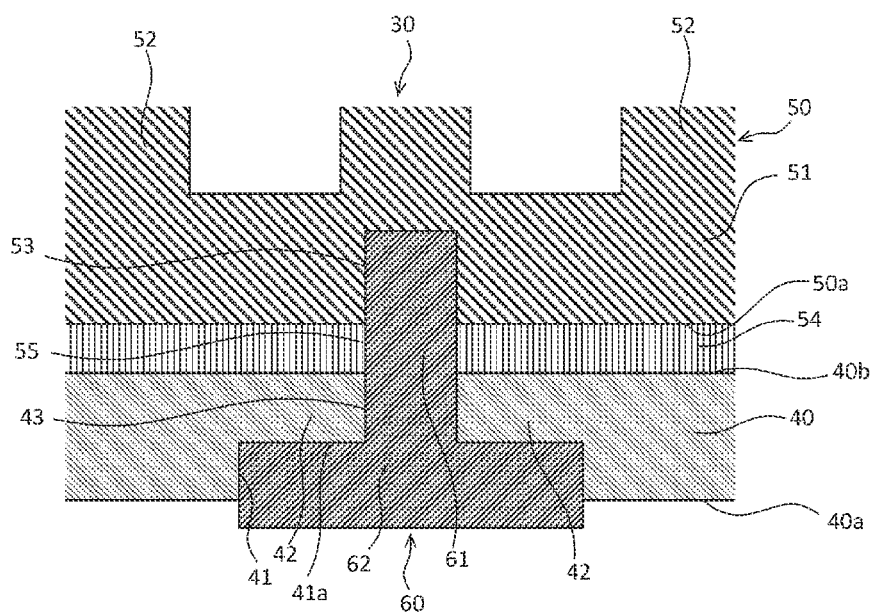
FIG. 10B is a cross-sectional view of a part of the light irradiator in which a fixing part is attached to a second through hole and a second screw hole of FIG. 10A.
Figure 11:
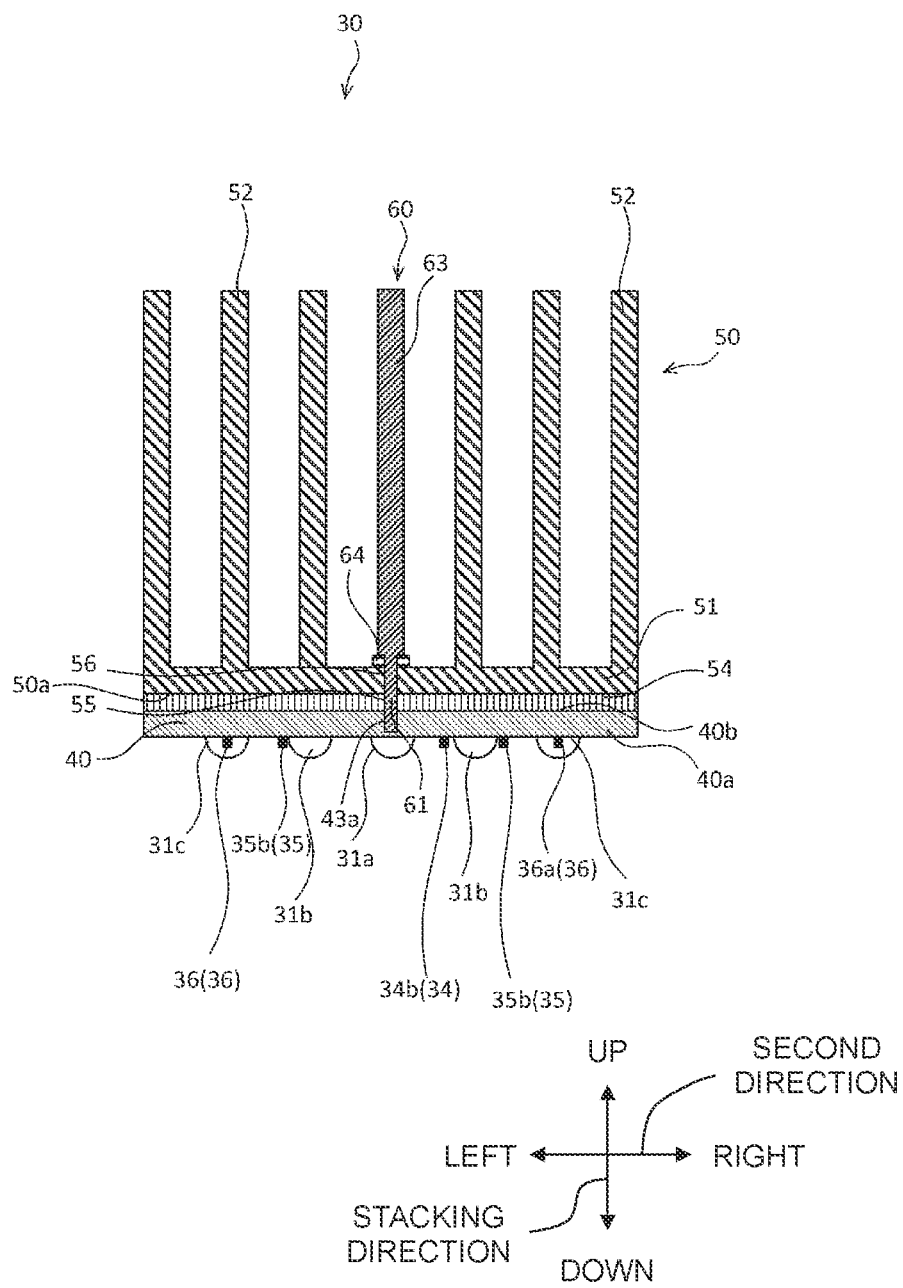
FIG. 11 is a cross-sectional view of a light irradiator.

In a light irradiator 30 according to a third modification, the substrate 40 has a front surface 40a to which the plurality of light sources 31 are attached; a back surface 40b to which the heat sink 50 is attached; a counterbore 41 recessed from the front surface 40a toward the back surface 40b; and a first through hole 43 penetrating both of the bottom surface 40b and a bottom surface 41a of the counterbore 41, as depicted in FIGS. 10A and 10B. The fixing part 60 has a head part 62 fitted into the counterbore 41 and a shaft part 61 extending form the head part 62 into the first through hole 43. The heat sink 50 has a facing surface 50a facing the hack surface 40b, and a first screw hole 53 which is formed in the facing surface 50a and to which the shaft part 61 is screwed.

The counterbore 41 is recessed, at the center of the substrate 40, upwardly from the lower surface; a space defined by the counterbore 41 has a shape of a circular cylinder. The bottom surface 41a of the counterbore 41 has a circular shape of which diameter is greater than the diameter of the head part 62 of the fixing part 60. The first through hole 43 is provided at the center of the bottom surface 41a of the counterbore 41, and penetrates both of the bottom surface 41a and the upper surface of the substrate 40 in the up-down direction. A space defined by the first through hole 43 has a shape of a circular cylinder.

In the substrate 40, a flange part 42 between the bottom surface 41a of the counterbore 41 and the upper surface of the substrate 40 protrudes or projects from an outer circumferential edge of the counterbore 41 toward the first through hole 43, and is inclined further downward as approaching closer to the first through hole 43. The shaft part 61 is inserted into the first through hole 43, the insertion hole 55 and the first screw hole 53 and is screwed to the first screw hole 53, the head part 62 is fitted into the counterbore 41, thereby pushing the flange part 42 upwardly. With this, although the fixing part 60 is easily loosen under a circumstance wherein change in the temperature is great due to the switching on and off of the light sources 31, the flange part 42 is interposed, as a spring washer, between the head part 62 and the heat sink 50, thereby making it possible to lower occurrence of such a situation that the fixing part 60 is detached from or comes off from the heat sink 50.

Further, since the head part 62 is fitted into the counterbore 41 recessed downwardly from the lower surface of the substrate 40, it is possible to shorten the length of the head part 62 projecting downwardly from the lower surface. With this, it is possible to lower occurrence of such a situation that the light(s) from the light sources 31 are shielded of blocked by the head part 62, thereby making it possible to lower any unevenness in the illuminance among the light source 31 due to the fixing part 60.

Fourth Modification

In a light irradiator 30 according to a fourth modification, the heat sink 50 has an attachment part 51 which is configured to be attached to the substrate 40 and a second through hole 56 penetrating through the attachment part 51. The fixing part 60 has a shaft part 61 inserted into the second through hole 56, and a fin-shaped head part 63 connected to the shaft part 61 and extending from the attachment part 51 in a direction that separates from the substrate 40. The substrate 40 has a front surface 40a to which the plurality of light sources 31 are attached, a back surface 40b to which the attachment part 51 is attached, and a second screw hole 43 which extends from the back surface 40b toward the front surface 40a and into which the shaft part 61 is screwed.

Specifically, the second screw hole 43a is provided on the substrate 40 at a center of the substrate 40. The second screw hole 43a is a hole to which the fixing part 60 is attached and in which, for example, a circular cross section orthogonal to the up-down direction is circular, which extends, in the up-down direction, downwardly from the upper surface to the lower surface of the substrate 40. A thread groove is provided on an inner surface, of the substrate 40, which surrounds the second screw hole 43a. Note that the second screw hole 43a may penetrate, in the up-down direction, through both of the lower surface and the upper surface of the substrate 40.

A second insertion hole 56 is provided on the attachment part 51 of the heat sink 50, at a position corresponding to the second screw hole 43a of the substrate 40. The second insertion hole 56 is a hole into which the shaft part 61 of the fixing part 60 is inserted, and in which, for example, a cross section orthogonal to the up-down direction is circular, and which extends in the up-down direction and penetrates both of the lower surface and the upper surface of the attachment part 51.

The shaft part 61 of the fixing part 60 is provided with a screw thread at least in a forward end area of the shaft part 61. The forward end area is an area, of the shaft part 61, which includes a forward end thereof, and is a range in which the shaft part 61 is inserted into the second screw hole 43a. Note that the screw thread may be provided over the entire length between the base end and the forward end of the shaft part 61.

The fin-shaped head part 63 has a shape which is similar to that of the fins 52 of the heat sink 50 and has, for example, a shape which is a circular cylinder. The fin-shaped head part 63 is connected to the base end of the shaft part 61 at a base end of the fin-shaped part 63, and has a diameter which is greater than the diameter of the second through hole 56. With this, in a case that the shaft part 61 is inserted into the second through hole 56, the insertion hole 55 and the second screw hole 43a and is screwed into the second screw hole 43a, the fin-shaped head part 63 abuts against (is brought into contact with) the upper surface of the attachment part 51 of the heat sink 50, and is locked thereto. The heat sink 50 is fixed to the substrate 40, by the fixing part 60, via the heat conductive material 54, and the heat of the substrate 40 is propagated to the heat sink 50 via the heat conductive material 54, thereby cooling the substrate 40. Note that a washer 64 may be interposed between the fin-shaped head part 63 and the attachment part 51.

Further, the fin-shaped head part 63 extends upward from the upper surface of the attachment part 51, in a similar manner to each of the plurality of fins 52. The fin-shaped head part 63 and the plurality of fins 52 are arranged at equal spacing distances therebetween in both of the front-rear direction and the left-right direction so that the distribution of the fin-shaped head part 63 and the plurality of fins 52 in the attachment part 51 becomes uniform. In such a manner, since the tin-shaped head part 63 achieves the effect similar to that achieved by the plurality of fins 52, it is possible to utilize the fin-shaped head part 63 effectively for the fixing and the cooling. Further, since the fin-shaped head part 63 does not protrude or project from the lower surface of the substrate 40, it is possible to lower any unevenness in the illuminance among the light source 31 due to the fin-shaped head part 63.

Fifth Modification

Figure 12:
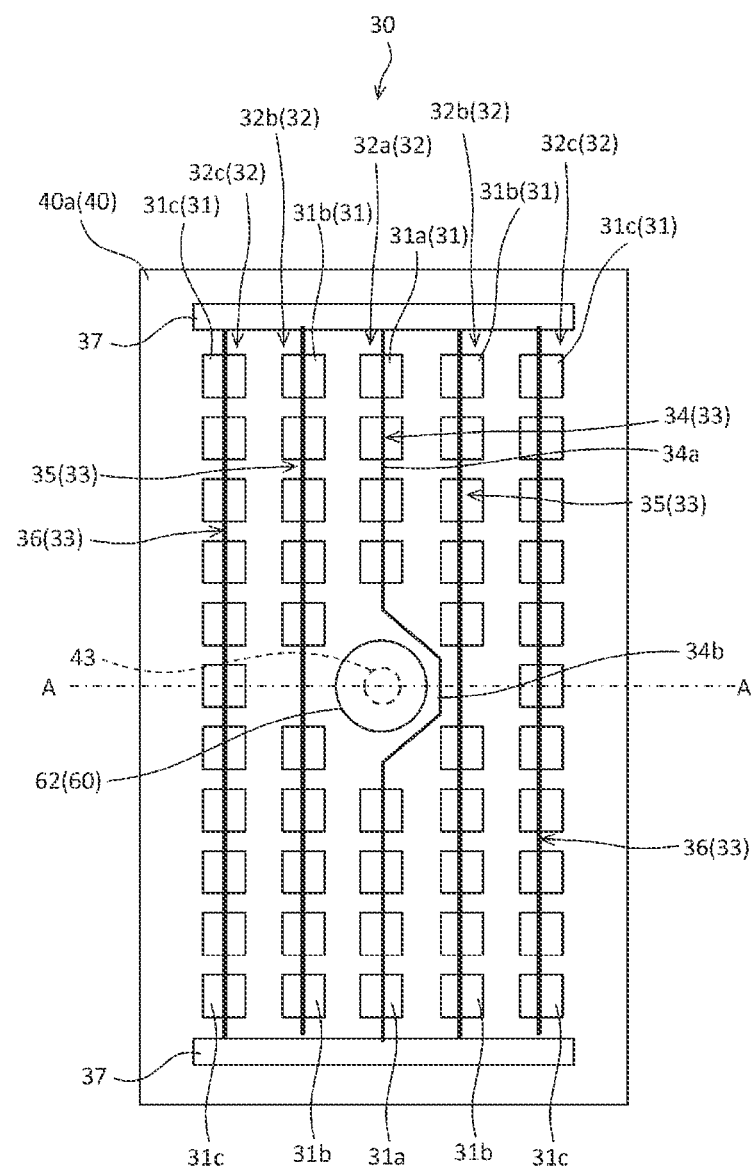
FIG. 12 is a view of a light irradiator, as seen therebelow.
Figure 12:
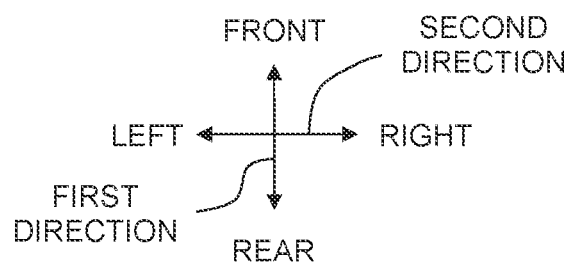

In a light irradiator 30 according to a fifth modification, a resistance in the first trace 34 is greater than a resistance in the second trace 35. For example, as depicted in FIG. 12, a front end of the second trace 35 is connected to the front-side connector 37, and a rear end of the second trace 35 is connected to the rear-side connector 37; the second trace 35 extends linearly in the front-rear direction between these two connectors 37 and is connected in series to each of 10 (ten) pieces of the second light source 31b. Accordingly, an entire length of the second trace 35 between a front-end second light source 31b and a rear-end second light source 31b is equal to the shortest distance of the second light source row 32b in the front-rear direction.

Such a second trace 35 has an electric resistance per unit length which is smaller than an electric resistance per unit length of the first trace 34. For example, it is allowable that the cross sectional area of the second trace 35 is greater than the cross-sectional area of the first trace 34. Alternatively, it is allowable that the second trace 35 is formed of a material of which electric resistance is smaller than that of the material forming the first trace 34.

Further, while the first trace 34 has the first circumventing part 34b, the second trace 35 according to the fifth modification does not have the second circumventing part 35b (FIG. 4). Accordingly, the length of the first trace 34 is longer than the length of the second trace 35. With this, the electric resistance in the first trace 34 itself is greater than the electric resistance in the second trace 35 itself. Note that the electric resistance per unit length of the second trace 35 may be made equal to the electric resistance per unit length of the first trace 34. In such a case, for example, a resistor may be arranged in each of the first trace 34 and the second trace 35. The electric resistance, of the first trace 34 itself, which is a combined resistance of the first trace 34 and the resistor provided on the first trace 34 may be made greater than the electric resistance, of the second trace 35 itself, which is the combined resistance of the second trace 35 and the resistor provided on the second resistor 35.

On the other hand, a number of the first light source 31a connected to the first trace 34 is smaller than a number of the second light source 31b connected to the second trace 35. Accordingly, combined resistance of all the first light sources 31a connected to the first trace 34 is smaller than combined resistance of all the second light sources 31b connected to the second trace 35. Accordingly, the combined resistance of the first trace 34 and all the first light sources 31a connected to the first trace 34 and the combined resistance of the second trace 35 and all the second light sources 31b connected to the second trace 35 are same as each other or close to each other. With this, it is possible to lower any unevenness in the illuminance among the plurality of light sources 31, even in a case that the number of the light sources 31 connected is different among the traces 33 due to the arrangement of the fixing part 60 and/or that the length is different among the traces 33 due to the circumvention in the traces 33.

Furthermore, the second trace 36 is similar to the second trace 35. The electric resistance per unit length of the third trace 36 is smaller than the electric resistance per unit length of the second trace 35. Since the second trace 35 and the third trace 36 has a same length, the electric resistance in the third trace 36 itself is smaller than the electric resistance in the second trace 35 itself. In contrast to this, a number of the third light source 31c connected to the third trace 36 is greater than the number of the second light source 31b connected to the second trace 35. Accordingly, the combined resistance in all the third light sources 31c connected to the third trace 36 is greater than the combined resistance of all the second light sources 31b connected to the second trace 35. Accordingly, the combined resistance of the third trace 36 and all the third light sources c connected to the third trace 36 and the combined resistance of the second trace 35 and all the second light sources 31b connected to the second trace 35 are same as each other or close to each other. With this, it is possible to lower any unevenness in the illuminance among the plurality of light sources 31, even in a case that the number of the light sources 31 connected is different among the traces 33 due to the arrangement of the fixing part 60 and/or that the length is different among the traces 33 due to the circumvention in the traces 33.

Other Modifications

Figure 13:
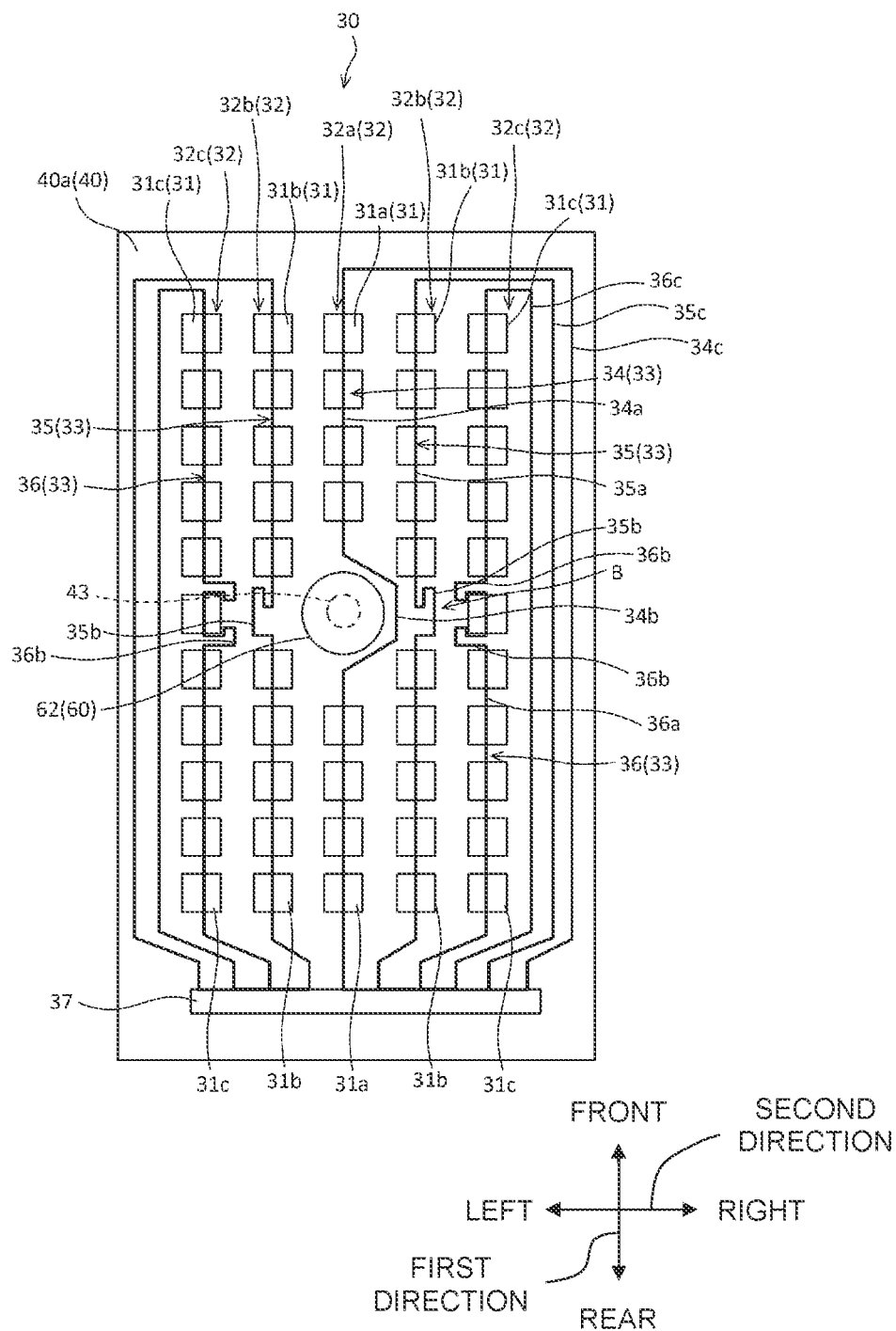
FIG. 13 is a view of a light irradiator, as seen therebelow.

As depicted in FIG. 13, it is allowable that the connector 37 connected to the trace 33 is provided on either one side in the front-rear direction. In an example depicted in FIG. 13, the first trace 34 has a first returning part 34c, in addition to the first connecting part 34a and the first circumventing part 34b. The first returning part 34c is connected to the front-side first connecting part 34a, extends to the right side, extends from the front side to the rear side on the right side with respect to the right-side third light source row 32c, and is connected to the connector 37.

The second trace 35 has a second returning part 35c, in addition to the second connecting part 35a and the second circumventing part 35b. The second returning part 35c of the right-side second trace 35 is connected to the front-side second connecting part 35a, extends to the right side, extends from the front side to the rear side on the right side with respect to the right-side third light source row 32c, and is connected to the connector 37. The second returning part 35c of the left-side second trace 35 is connected to the front-side second connecting part 35a, extends to the left side, extends from the front side to the rear side on the left side with respect to the left-side third light source row 32c, and is connected to the connector 37.

The third trace 36 has a third returning part 36c, in addition to the third connecting part 36a and the third circumventing part 36b. The third returning part 36c of the right-side third trace 36 is similar to the second returning part 35c of the right-side second trace 35, and the third returning part 36c of the left-side third trace 36 is similar to the second returning part 35c of the left-side second trace 35.

In such a light irradiator 30, the length of the second circumventing part 35b and the length of the third circumventing part 36c are set so that the current flowing through the first light sources 31a via the first trace 34, the current flowing through the second light sources 31b via the second trace 35 and the current flowing through the third light sources 31c via the third trace 36 are same as one another or close to one another. With this, it is possible to suppress any unevenness in the illuminance among the first light sources 31a, the second light sources 31b and the third light sources 31c, while suppressing any increase in the size of the light irradiator 30.

As depicted in FIG. 13, it is allowable that each of the second trace 35 and the third trace 36 is bent at a connection part thereof connecting to the connector 37 so as to approach closer to the center in the left-right direction. With this, a length of the connection part and/or a length of the returning part of each of the traces 33 are/is different among the first trace 34, the second trace 35 and the third trace 36. In such a case, the lengths of the respective circumventing parts are adjusted so that the currents the first light sources 31b, the current of the second light sources 31b and the current of the third light sources 31c are same as on another or close to one another, With this, it is possible to suppress any unevenness in the illuminance among the first light sources 31a, the second light sources 31b and the third light sources 31c, while suppressing any increase in the size of the light illuminating unit 30.

As depicted in FIG. 13, it is allowable that a plurality of (for example, two pieces of) the third circumventing part 36c are provided on the third trace 36. In the example depicted in FIG. 13, a third circumventing part 36b is provided between a third light source 31c which is the fifth from the front and a third light source 31c which is the sixth from the front among the third light sources 31c; and another third circumventing part 36b is provided between the third light source 31c which is the sixth from the front and a third light source 31c which is the seventh from the front among the third light sources 31c. With this, it is possible to arrange the third circumventing parts 36b on the substrate, without interfering with the second circumventing part 35b. Note that it is allowable that the second circumventing part 35b is also provided as a plurality of second circumventing parts 35b on the second trace 35.

In all the embodiments and all the modifications, the second circumventing part 35b is arranged between the front-end second light source 31b and the rear-end second light source 31b in the front-rear direction. Note that, however, under a condition that the second circumventing part 35b is present on the lower surface of the substrate 40, the position of the second circumventing part 35b is not limited to or restricted by this. For example, the second circumventing part 35b may be arranged at the front side with respect to the front-end second light source 31b on the lower surface of the substrate 40, or the second circumventing part 35b may be arranged at the rear side with respect to the rear-end second light source 31b on the lower surface of the substrate 40. Note that the third circumventing part 36b may also arranged similarly to the second circumventing part 35b.

In all the embodiments and all the modifications, the serial head system in which the head 20 is moved in the left-right direction by the carriage 72 is used in the liquid discharging head 10. It is allowable, however, that a line head system in which the carriage 72 is not provided and that the head 20 is fixed is used in the liquid discharging head 10.

Note that all the embodiments and all the modifications may be combined with each other as long as all the embodiments and all the modifications are not mutually exclusive.

Further, from the above-described explanation, numerous improvements and/or other embodiments of the present disclosure will be apparent to those skilled in the art. Accordingly, the foregoing explanation should be interpreted as a mere example, and as being provided for the purpose of providing, to those skilled in the art, the best mode for carrying out the present disclosure. The configuration and/or the detailed function of the present disclosure may be substantially changed, without departing from the spirit of the present disclosure.

The light irradiator and the liquid discharging apparatus of the present disclosure are each effective as a light irradiator and a liquid discharging apparatus capable of lowering the unevenness (variation) in illuminance among the light sources.

What is claimed is:

1. A light irradiator comprising:
   a plurality of light sources;
   a heat sink;
   a substrate to which the plurality of light sources are attached, and which includes a plurality of traces connected to the plurality of light sources; and
   a fixing part configured to fix the heat sink to the substrate,
   wherein the plurality of light sources form a first light source row extending in a first direction, and a second light source row extending in the first direction and arranged side by side to the first light source row in a second direction orthogonal to the first direction,
   wherein the fixing part is arranged between adjacent light sources of light sources, among the plurality of light sources, included in the first light source row, the adjacent light sources being adjacent in the first light source row,
   wherein the fixing part is not arranged between adjacent light sources, of light sources, among the plurality of light sources, included in the second light source row, the adjacent light sources being adjacent in the second light source row,
   wherein the plurality of traces include a first trace connected to the light sources included in the first light source row, and a second trace connected to the light sources included in the second light source row,
   wherein the first trace includes a first circumventing part configured to circumvent the fixing part, and
   wherein the second trace includes a second circumventing part configured to circumvent the fixing part and including a directional component different from the first direction.

2. The light irradiator according to claim 1, wherein the second light source row includes one-end light source included in the light sources and located at one end in the first direction, and the other-end light source included in the light sources and located on the other end in the first direction, and
   wherein the second circumventing part is arranged between the one-end light source and the other-end light source in the first direction.

3. The light irradiator according to claim 1, wherein the second trace includes a connecting part connected to the light sources of the second light source row, and extending in the first direction, and
   wherein the second circumventing part is provided at a position closer to the fixing part than the connecting part.

4. The light irradiator according to claim 1, wherein the substrate includes a surface to which the plurality of light sources are attached;

wherein the second circumventing part is provided on a space in the surface, the space being arranged side by side to the fixing part in the second direction, and wherein the space is located between the adjacent light sources which are adjacent in the first direction in the second light source row.

5. The light irradiator according to claim 4, wherein in the second light source row, a spacing distance between the adjacent light sources which are adjacent in the first direction with the space being interposed therebetween is wider than a spacing distance between another adjacent light sources, of the light sources included in the second light source row, which are adjacent in the second light source row and which are arranged on one side in the first direction with respect to the space.

6. The light irradiator according to claim 1, wherein the substrate includes a plurality of layers which are stacked in a stacking direction orthogonal to the first direction and the second direction, and wherein the first circumventing part and the second circumventing part are provided on different two layers, respectively, which are included in the plurality of layers.

7. The light irradiator according to claim 6, wherein the second circumventing part circumvents the fixing part in the stacking direction.

8. The light irradiator according to claim 7, wherein the light sources included in the second light source row are arranged at an equal spacing distances therebetween in the first direction.

9. The light irradiator according to claim 6, wherein the plurality of layers of the substrate have not less than three layers, wherein the plurality of light sources form a third light source row which extends in the first direction and which is arranged side by side to the second light source row in the second direction, wherein the fixing part is not arranged between adjacent light sources, of light sources, among the plurality of light sources, included in the third light source row, the adjacent light sources being adjacent in the third light source row, wherein the trace includes a third trace connected to the light sources which are included in the third light source row;

wherein the third trace includes a third circumventing part which is configured to circumvent the fixing part and which includes a positional component different from the first direction, and wherein the second circumventing part and the third circumventing part are provided on different two layers, respectively, which are included in the plurality of layers.

10. The light irradiator according to claim 1, wherein the substrate includes a front surface to which the plurality of light sources are attached, and a back surface to which the heat sink is attached, wherein a counterbore recessed from the front surface toward the back surface, and a first through hole penetrating both of a bottom surface of the counterbore and the back surface are formed in the substrate, wherein the fixing part includes a head part fitted into the counterbore and a shaft part extending from the head part into the first through hole; and wherein the heat sink includes a facing surface facing the back surface, and a first screw hole which is formed in the facing surface and to which the shaft part is screwed.

11. The light irradiator according to claim 1, wherein the heat sink has an attachment part configured to be attached to the substrate, a second through hole penetrating through the attachment part being formed in the attachment part, wherein the fixing part includes a shaft part inserted into the second through hole, and a fin-shaped head part connected to the shaft part and extending from the attachment part in a direction that separates from the substrate, and wherein the substrate includes a front surface to which the plurality of light sources are attached, a back surface to which the attachment part is attached, and a second screw hole which extends from the back surface toward the front surface and into which the shaft part is screwed.

12. A liquid discharge apparatus comprising:

the light irradiator as defined in claim 1;

a head configured to discharge, to a medium, a liquid which is curable by a light irradiated from the light irradiator; and a conveyer configured to convey the medium in a conveying direction parallel to the first direction.

13. The liquid discharge apparatus according to claim 12, further comprising a carriage configured to move the head in an orthogonal direction which is orthogonal to the conveying direction.

14. A light irradiator comprising:

a plurality of light sources;

a heat sink;

a substrate to which the plurality of light sources are attached, and which includes a plurality of traces connected to the plurality of light sources; and a fixing part configured to fix the heat sink to the substrate, wherein the plurality of light sources form a first light source row extending in a first direction, and a second light source row extending in the first direction and arranged side by side to the first light source row in a second direction orthogonal to the first direction, wherein the fixing part is arranged between adjacent light sources of light sources, among the plurality of light sources, included in the first light source row, the adjacent light sources being adjacent in the first light source row, wherein the fixing part is not arranged between adjacent light sources, of light sources, among the plurality of light sources, included in the second light source row, the adjacent light sources being adjacent in the second light source row, wherein the number of the light sources included in the first light source row is smaller than the number of the light sources included in the second light source row, wherein the trace includes a first trace connected to the light sources included in the first light source row, and a second trace connected to the light sources included in the second light source row;

wherein resistance in the first trace is greater than resistance in the second trace.

15. The light irradiator according to claim 14, wherein the substrate includes a front surface to which the plurality of light sources are attached, and a back surface to which the heat sink is attached, wherein a counterbore recessed from the front surface toward the back surface, and a first through hole penetrating both of a bottom surface of the counterbore and the back surface are formed in the substrate, wherein the fixing part includes a head part fitted into the counterbore and a shaft part extending from the head part into the first through hole, and the heat sink includes a facing surface facing the back surface, and a first screw hole which is formed in the facing surface and to which the shaft part is screwed.

16. The light irradiator according to claim 14, wherein the heat sink has an attachment part configured to be attached to the substrate, a second through hole penetrating through the attachment part being formed in the attachment part, wherein the fixing part includes a shaft part inserted into the second through hole, and a fin-shaped head part connected to the shaft part and extending from the attachment part in a direction that separates from the substrate, and the substrate includes a front surface to which the plurality of light sources are attached, a back surface to which the attachment part is attached, and a second screw hole which extends from the back surface toward the front surface and into which the shaft part is screwed.

17. A liquid discharge apparatus comprising:

the light irradiator as defined in claim 14;

a head configured to discharge, to a medium, a liquid which is curable by a light irradiated from the light irradiator; and a conveyer configured to convey the medium in a conveying direction parallel to the first direction.

18. The liquid discharging apparatus according to claim 17, further comprising a carriage configured to move the head in an orthogonal direction which is orthogonal to the conveying direction.

19. The liquid discharge apparatus according to claim 12, wherein the number of the light sources included in the first light source row is smaller than the number of the light sources included in the second light source row, and wherein resistance in the first trace is greater than resistance in the second trace.

20. The liquid discharge apparatus according to claim 17, wherein the first trace includes a first circumventing part configured to circumvent the fixing part, and wherein the second trace includes a second circumventing part configured to circumvent the fixing part and including a directional component different from the first direction.

* * * * *